(12) United States Patent
Seo

(10) Patent No.: US 12,262,489 B2
(45) Date of Patent: Mar. 25, 2025

(54) DISPLAY DEVICE

(71) Applicant: Samsung Display Co., LTD., Yongin-si (KR)

(72) Inventor: Eun Won Seo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 191 days.

(21) Appl. No.: 18/075,651

(22) Filed: Dec. 6, 2022

(65) Prior Publication Data

US 2023/0276583 A1    Aug. 31, 2023

(30) Foreign Application Priority Data

Feb. 28, 2022    (KR) .................. 10-2022-0026171

(51) Int. Cl.
*H05K 5/00*    (2006.01)
*G06F 1/16*    (2006.01)
*H05K 5/02*    (2006.01)
*H01L 25/16*    (2023.01)

(52) U.S. Cl.
CPC ......... *H05K 5/0217* (2013.01); *G06F 1/1652* (2013.01); *H01L 25/167* (2013.01)

(58) Field of Classification Search
CPC .......................... H05K 5/0217; G06F 1/1652
USPC ......................................................... 361/807
See application file for complete search history.

(56) References Cited

U.S. PATENT DOCUMENTS

| | | | |
|---|---|---|---|
| 10,257,945 B2 | 4/2019 | Kim et al. | |
| 10,331,173 B2 | 6/2019 | Cho | |
| 10,684,652 B2 | 6/2020 | Kim et al. | |
| 10,783,809 B2* | 9/2020 | Kim | G09F 9/301 |
| 2016/0161983 A1* | 6/2016 | Lee | G06F 1/1652 |
| | | | 361/749 |
| 2017/0013726 A1* | 1/2017 | Han | G09F 15/0062 |
| 2017/0156225 A1* | 6/2017 | Heo | G06F 1/1681 |
| 2020/0196459 A1* | 6/2020 | Huang | H05K 5/0017 |
| 2021/0272486 A1* | 9/2021 | Khachatryan | G09F 9/301 |

FOREIGN PATENT DOCUMENTS

| | | |
|---|---|---|
| CN | 107342018 | 5/2020 |
| KR | 10-2018-0043441 | 4/2018 |
| KR | 10-2020-0014112 | 2/2020 |
| KR | 6735552 | 8/2020 |
| KR | 10-2021-0041665 | 4/2021 |
| KR | 10-2369318 | 3/2022 |

* cited by examiner

*Primary Examiner* — Zhengfu J Feng
(74) *Attorney, Agent, or Firm* — KILE PARK REED & HOUTTEMAN PLLC

(57) ABSTRACT

A display device includes: a display panel having pixels; a first rotating member that rolls and unrolls the display panel; a support member supporting the display panel; and a central member disposed between the display panel and the support member and coupling the display panel and the support member. The central member includes a bending part.

20 Claims, 14 Drawing Sheets

DISPLAY DEVICE

CROSS-REFERENCE TO RELATED APPLICATION(S)

This application claims priority to and benefits of Korean patent application No. 10-2022-0026171 under 35 U.S.C. § 119(a), filed on Feb. 28, 2022, in the Korean Intellectual Property Office (KIPO), the entire contents of which are incorporated herein by reference.

BACKGROUND

1. Technical Field

Embodiments relate to a display device.

2. Description of the Related Art

Recently, as interest in information displays is increased, research and development of display devices have been continuously conducted.

SUMMARY

Embodiments provide a display device having a structure in which a display panel may be more stably supported in case that the display panel is unrolled by a rotating member.

In an embodiment, a display device may include: a display panel including pixels; a first rotating member that rolls and unrolls the display panel; a support member supporting the display panel; and a central member disposed between the display panel and the support member, the central member coupling the display panel and the support member, wherein the central member may include a bending part.

The display device may further include a second rotating member that rolls and unrolls the support member.

The display device may further include a third rotating member that rolls and unrolls the central member.

The third rotating member may be disposed between the first rotating member and the second rotating member.

The display device may further include a housing accommodating the display panel.

The first rotating member, the second rotating member, and the third rotating member may be disposed in the housing.

The display device may further include a first guide bar disposed between the first rotating member and the second rotating member. The first guide bar may be disposed over the third rotating member.

A portion of the display panel and a portion of the central member, which face the first guide bar, may be separated from each other by the first guide bar.

The display device may further include a second guide bar disposed between the first rotating member and the second rotating member. The second guide bar may be disposed over the third rotating member A portion of the support member and a portion of the central member, which face the second guide bar, may be separated from each other by the second guide bar.

The bending part may be coupled to the display panel, and continuously extend along the display panel and the support member.

The bending part may be coupled to the central member, and continuously extend along the display panel and the support member.

In an embodiment, a display device may include: a display panel having pixels; a first rotating member that rolls and unrolls the display panel; a support member supporting the display panel; and a central member disposed between the display panel and the support member, wherein the central member may include a first bending part coupled to the display panel and a second bending part coupled to the support member.

The first bending part may be bent in a first direction, the second bending part may be bent in a second direction opposite to the first direction, and the first bending part and the second bending part may be alternately arranged.

The central member may have elasticity.

The central member may include a base layer and an electrode layer on the base layer.

The electrode layer may be disposed at the first bending part and the second bending part.

The first bending part and the display panel may be coupled to each other by an electrostatic force.

The central member may include a magnet disposed at the first bending part and the second bending part.

The first bending part and the display panel may be coupled to each other by a magnetic force.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION OF THE EMBODIMENTS

Figure 1:
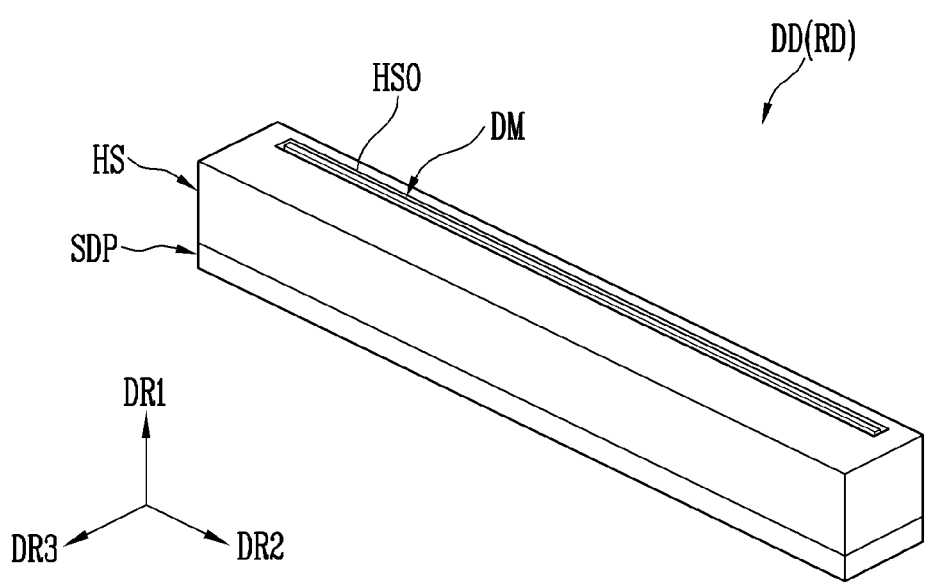
FIG. 1 is a schematic perspective view illustrating a display device in accordance with an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, embodiments will be described in more detail with reference to the accompanying drawings.

Figure 2:
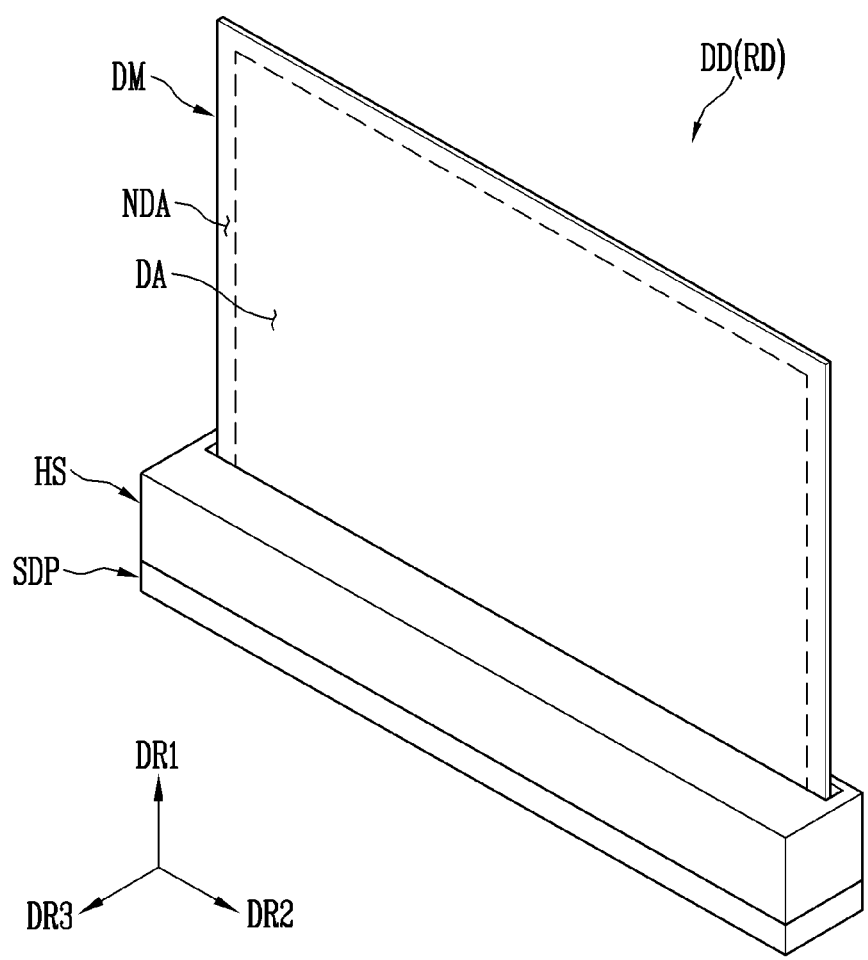
FIG. 2 is a schematic perspective view illustrating a state in which a display mode is unrolled in the display device in accordance with an embodiment.

FIG. 1 is a schematic perspective view illustrating a display device in accordance with an embodiment. FIG. 2 is a schematic perspective view illustrating a state in which a display mode is unrolled in the display device in accordance with an embodiment.

Referring to FIGS. 1 and 2, the display device DD in accordance with the embodiment may be a rollable display device RD.

The display device DD may include a housing HS and a mounting part SDP. A display module DM rolled with a curvature (e.g., a predetermined curvature) may be located inside the housing HS. The display module DM may be a rollable display module.

The housing HS may be an instrument accommodating the rolled display module DM therein, and a slot HSO (or a housing opening), through which the display module DM pass, may be formed at a side surface of the housing HS. A rotating member (or a roller) may be rotatably installed inside the housing HS. The rotating member may be accommodated in the housing HS to roll and/or unroll the display module DM (or a display panel). The rotating member may have a cylindrical shape extending in a second direction DR2. The display module DM may be rolled on an outer surface of the rotating member. The rotating member will be described in detail later with reference to FIG. 6.

The slot HSO of the housing HS may be a path for rolling (or winding) and unrolling (or unwinding) of the display module DM. In an example, the display module DM may be rolled inside the housing HS through the slot HSO of the housing HS, or be unrolled to the outside of the housing HS (e.g., in a first direction DR1) through the slot HSO of the housing HS.

A shape of the slot HSO of the housing HS may correspond to a sectional shape of the display module DM, but embodiments are not limited thereto.

The mounting part SDP may be disposed at a side of the housing HS. The mounting part SDP may include a controller for outputting an image to the display module DM, a power supply, a speaker for outputting a sound, an input/output terminal capable of inputting or outputting several signals, and a wireless transceiver capable of transmitting or receiving a signal by wireless. Therefore, various control printed circuit boards of the controller and various power supply printed circuit boards of the power supply may be installed inside the mounting part SDP, but embodiments are not limited thereto.

The display module DM may display an image. For example, the display module DM may display the image in a third direction DR3, but embodiments are not limited thereto. For example, the display module DM may display the image in the opposite direction of the third direction DR3 or both the directions.

The display module DM (or the display panel) may have flexibility. In an example, the display module DM may have a rolling characteristic. Accordingly, in case that the display device DD is in a closed mode, the display module DM may be rolled to be accommodated inside the housing HS. In case that the display device DD is in an open mode, the display module DM may be extracted (or unwound) in the opposite direction of the rolling direction to be unrolled in a direction from the housing HS.

The display module DM may be changed from a state in which the display module DM is rolled (e.g., completely rolled) to a state in which the display module DM is unrolled (e.g., completely unrolled), or be changed from the state in which the display module DM is unrolled (e.g., completely unrolled) to the state in which the display module DM is rolled (e.g., completely rolled). The state in which the display module DM is rolled (e.g., completely rolled) may mean a state in which the display module DM is accommodated inside the housing HS such that the display device DD does not display any image. In some embodiments, the display module DM may be changed from the state in which the display module DM is rolled (e.g., completely rolled) to a state in which only a portion of the display module DM is unrolled. The state in which only a portion of the display module DM is unrolled may mean a state in which the portion of the display module MD is disposed at the outside of the housing HS.

The display module DM may be formed in various shapes. In an example, the display module DM may be formed in a rectangular plate shape having two pairs of sides parallel to each other, but embodiments are not limited thereto. In case that the display module DM is formed in the rectangular plate shape, one pair among the two pairs of sides may be longer that the other pair of sides. Although a case where the display module DM has an angled corner portion including straight lines is illustrated in the drawings, embodiments are not limited thereto.

The display module DM may include a display area DA in which an image is displayed and a non-display area NDA disposed at at least one side of the display area DA. The non-display area NDA may be an area in which the image is not displayed.

In some embodiments, the display module DM may include a sensing area and a non-sensing area. The display module DM may not only display an image through the sensing area but also sense a touch input made on a display surface (or an input surface) or sense light incident from the front. The non-sensing area may surround the sensing area. However, this is merely illustrative, and embodiments are not limited thereto. In some embodiments, a partial area of the display area DA may correspond to the sensing area.

Figure 3:
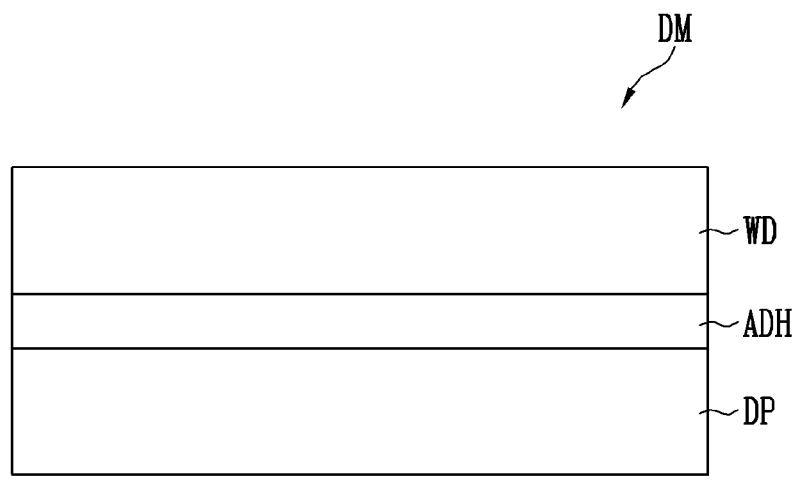
FIG. 3 is a schematic cross-sectional view of a display module in accordance with an embodiment.
Figure 4:
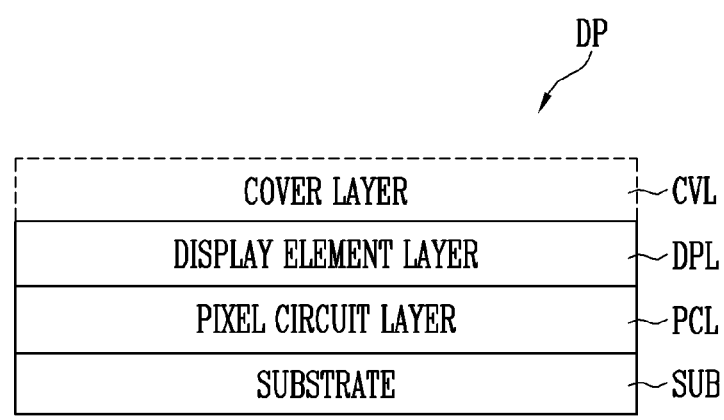
FIG. 4 is a schematic cross-sectional view of a display panel included in the display module in accordance with an embodiment.

FIG. 3 is a schematic cross-sectional view of a display module in accordance with an embodiment. FIG. 4 is a schematic cross-sectional view of a display panel included in the display module in accordance with an embodiment.

Referring to FIGS. 1 to 4, the display module DM may include a display panel DP, a window WD, and an adhesive layer ADH.

The display panel DP may display an image. A self-luminescent display panel, such as an Organic Light Emitting Display panel (OLED panel) including an organic light emitting diode as a light emitting element, a micro-LED or nano-LED display panel including a micro-LED or nano-LED as a light emitting element, or a Quantum Dot Organic Light Emitting Display panel (QD OLED panel) including a quantum dot and an organic light emitting diode, may be used as the display panel DP. For example, a non-self-luminescent display panel, such as an Electro-Phoretic Display panel (EPD panel), or an Electro-Wetting Display panel (EWD panel), may be used as the display panel DP. In case that a non-self-luminescent display panel is used as the display panel DP, the display device DD may include a backlight unit for supplying light to the display panel DP.

The display panel DP may include a substrate SUB, and a pixel circuit layer PCL, a display element layer DPL, and a cover layer CVL, which are sequentially located on the substrate SUB.

The substrate SUB may include an area having a rectangular shape. However, the number of areas disposed in the substrate SUB may be different from the above-described example, and the substrate SUB may have different shapes according to areas disposed to the substrate SUB.

The substrate SUB may be made of an insulative material such as glass or resin. Also, the substrate SUB may be made of a material having flexibility to be bendable or foldable, and have a single-layered structure or a multi-layered structure. For example, the material having flexibility may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and the like. However, the material of the substrate SUB is not limited thereto.

The pixel circuit layer PCL may be formed on the substrate SUB, and include transistors and signal lines connected to the transistors. For example, each transistor may have a form in which a semiconductor layer, a gate electrode, a first terminal, and a second terminal are sequentially stacked with insulating layers interposed therebetween. The semiconductor layer may include amorphous silicon, poly-silicon, low temperature poly-silicon, an organic semiconductor, and an oxide semiconductor. The gate electrode, the first terminal, and the second terminal may include at least one of aluminum, copper, titanium, and molybdenum, but embodiments are not limited thereto. Also, the pixel circuit layer PCL may include at least one insulating layer.

The display element layer DPL may be disposed on the pixel circuit layer PCL. The display element layer DPL may include a light emitting element emitting light. The light emitting element may be, for example, an organic light emitting diode, but embodiments are not limited thereto. In some embodiments, the light emitting element may be an inorganic light emitting element including an inorganic light emitting material or a light emitting element emitting light by changing the wavelength of light emitted by using a quantum dot.

The cover layer CVL (or an encapsulation layer) may be selectively disposed on the display element layer DPL. The cover layer CVL may be in the form of an encapsulation substrate or an encapsulation layer formed as a multi-layer. In case that the cover layer CVL is in the form of the encapsulation layer, the cover layer CVL may include an inorganic layer and/or an organic layer. For example, the cover layer CVL may be in a form in which an inorganic layer, an organic layer, and an inorganic layer are sequentially stacked. The cover layer CVL may prevent external air and external moisture from infiltrating into the display element layer DPL and the pixel circuit layer PCL.

In some embodiments, the cover layer CVL may be made of thermosetting resin and/or photocurable resin. Therefore, after the cover layer CVL is coated in a liquid form on the substrate SUB, the cover layer CVL may be cured through a curing process using heat and/or light. Thus, the cover layer CVL may more stably fix the light emitting element, thereby protecting the light emitting element.

The window WD for protecting an exposed surface of the display panel DP may be disposed on the display panel DP. The window WD may protect the display panel DP from external impact, and provide an input surface and/or a display surface to a user. The window WD may be coupled to the display panel DP by using the adhesive layer ADH. The adhesive layer ADH may include an optically clear adhesive material.

The window WD may have a multi-layer structure, and be selected from a glass substrate, a plastic film, and a plastic substrate. The multi-layer structure may be formed by a continuous process or an adhesion process using an adhesive layer. The whole or a portion of the window WD may have flexibility.

A touch sensor may be disposed between the display panel DP and the window WD. The touch sensor may be disposed (e.g., directly disposed) on a surface on which an image is emitted from the display panel DP to receive a touch input of a user.

Figure 5:
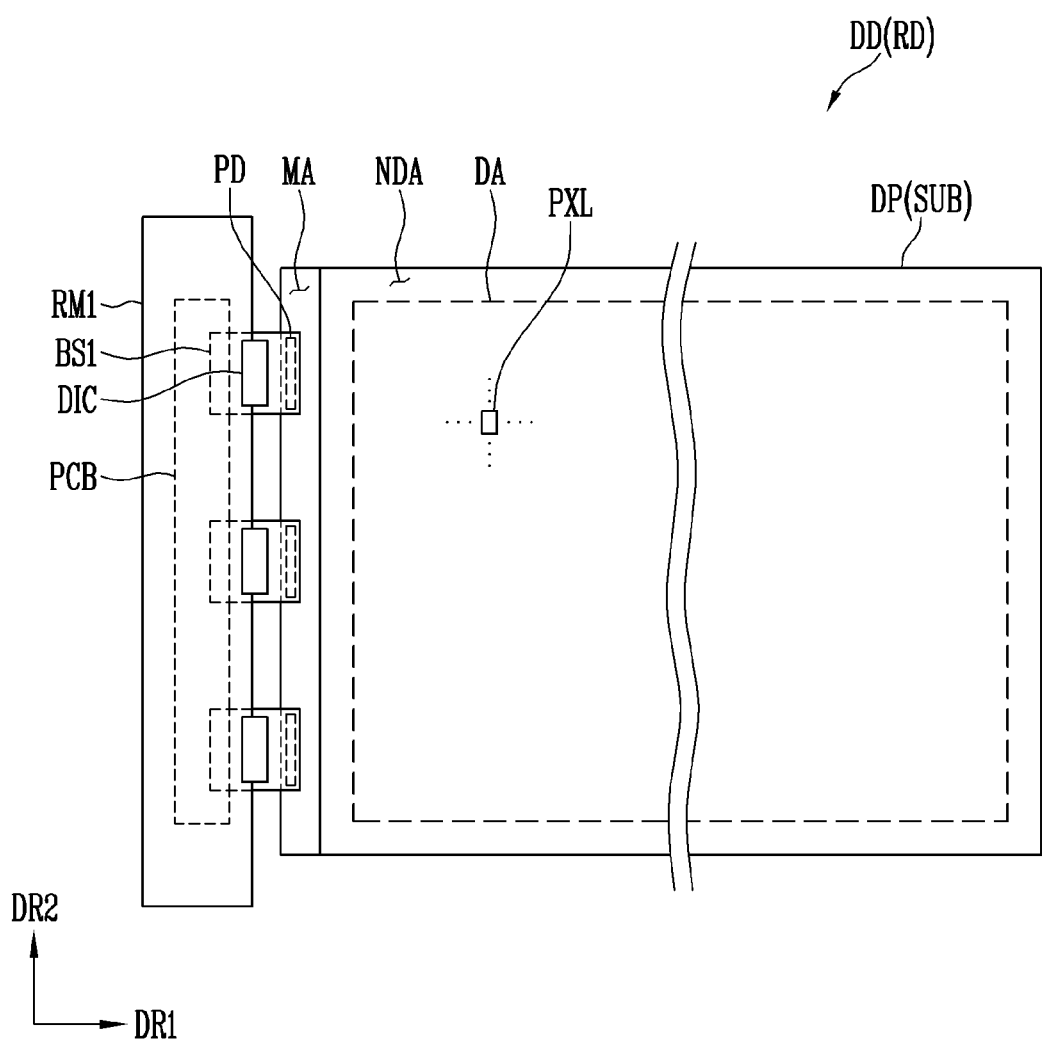
FIG. 5 is a schematic plan view illustrating a portion of the display device in accordance with an embodiment.

FIG. 5 is a schematic plan view illustrating a portion of the display device in accordance with an embodiment.

Referring to FIGS. 1 to 5, the display device DD may include a display panel DP, a driving integrated circuit DIC, a circuit board PCB, and/or a first rotating member RM1.

The display panel DP may include a display area DA and a non-display area NDA. The display area DA may be an area in which pixels PXL for displaying an image are disposed. The non-display area NDA may be an area in which the pixels PXL are not disposed, and may be an area in which the image is not displayed.

The non-display area NDA may be disposed at at least one side of the display area DA. The non-display area NDA may surround the circumference (or an edge portion) of the display area DA. A line part connected to the pixels PXL and the driving integrated circuit DIC, which is connected to the line part and drives the pixels PXL, may be disposed in the non-display area NDA. The non-display area NDA may include a mounting area MA in which the circuit board PCB is coupled to the display panel DP. In an example, the mounting area MA may be an area of the non-display area NDA. A pad part PD including pads may be located in the mounting area MA. The pad part PD may be physically and/or electrically to the circuit board PCB through a conductive adhesive member. Also, the pad part PD may be electrically connected to the driving integrated circuit DIC through the circuit board PCB. The conductive adhesive member may include an anisotropic conductive film.

The line part may connect (e.g., electrically connect) the driving integrated circuit DIC and the pixels PXL to each other. The line part may include signal lines which provide a signal to each pixel PXL and are connected to each pixel PXL, e.g., fan-out lines connected to a scan line, a data line, and the like.

The pixels PXL may be disposed in the display area DA of the display panel DP (or the substrate SUB). In an example, the pixels PXL may be disposed on a surface of the substrate SUB located in the display area DA. For convenience of description, only one pixel PXL is illustrated in FIG. 5, but pixels PXL may be substantially disposed on the surface of the substrate SUB. Each of the pixels PXL may be a minimum unit for displaying an image. Each of the pixels PXL may include a light emitting element emitting white light and/or colored light. Each of the pixels PXL may emit light of at least one color among red, green, and blue. However, embodiments are not limited thereto, and each of the pixels PXL may emit light of a color including cyan, magenta, yellow, and the like.

The pixels PXL may be arranged in a matrix form along rows extending in the first direction DR1 and columns extending in the second direction DR2. However, the arrangement of the pixels PXL is not particularly limited, and the pixels PXL may be arranged in various forms. Although a case where the pixels PXL have a rectangular shape is illustrated in the drawing, embodiments are not limited thereto, and the pixels PXL may be modified to have various shapes. For example, in case that the pixel PXL is provided in plural, the pixels PXL may be formed to have different areas (or sizes). For example, in the case of pixels PXL emitting lights of different colors, the pixels PXL with respect to the different colors may be disposed in different areas (or sizes) or different shapes.

The driving integrated circuit DIC may be mounted on a surface of a first base layer BS1 (or a first base substrate) to be connected (e.g., electrically connected) to the circuit board PCB and the pad part PD. The driving integrated circuit DIC may receive signals output from the circuit board PCB, and output signals (e.g., predetermined signals), a driving voltage, and the like, which are to be provided to the pixels PXL, based on the received signals. The signals (e.g., predetermined signals) and the driving voltage, which are described above, may be transferred to the pixels PXL through the pad part PD. The circuit board PCB may supply image data, a control signal, a power voltage, and the like to the display panel DP.

The display panel DP may be connected to the first rotating member RM1 to be rolled on the first rotating member RM1. In some embodiments, a portion of the display panel DP may be accommodated in the first rotating member RM1 or be coupled (e.g., physically coupled) to the first rotating member RM1. The display panel DP may be rolled (e.g., entirely rolled) with a constant curvature.

The first rotating member RM may be coupled to an end portion of the display panel DP to roll and/or unroll the display panel DP. A rotating operation of the first rotating member RM1 may be performed by a rotational force generated from a motor accommodated inside the housing HS. In case that the first rotating member RM1 is rotated in a direction (or a first rotational direction), the display panel DP may be rolled on the first rotating member RM1. In case that the first rotating member RM1 is rotated in the other direction (or a second rotational direction), the display panel DP may be unrolled from the first rotating member RM1.

Figure 6:
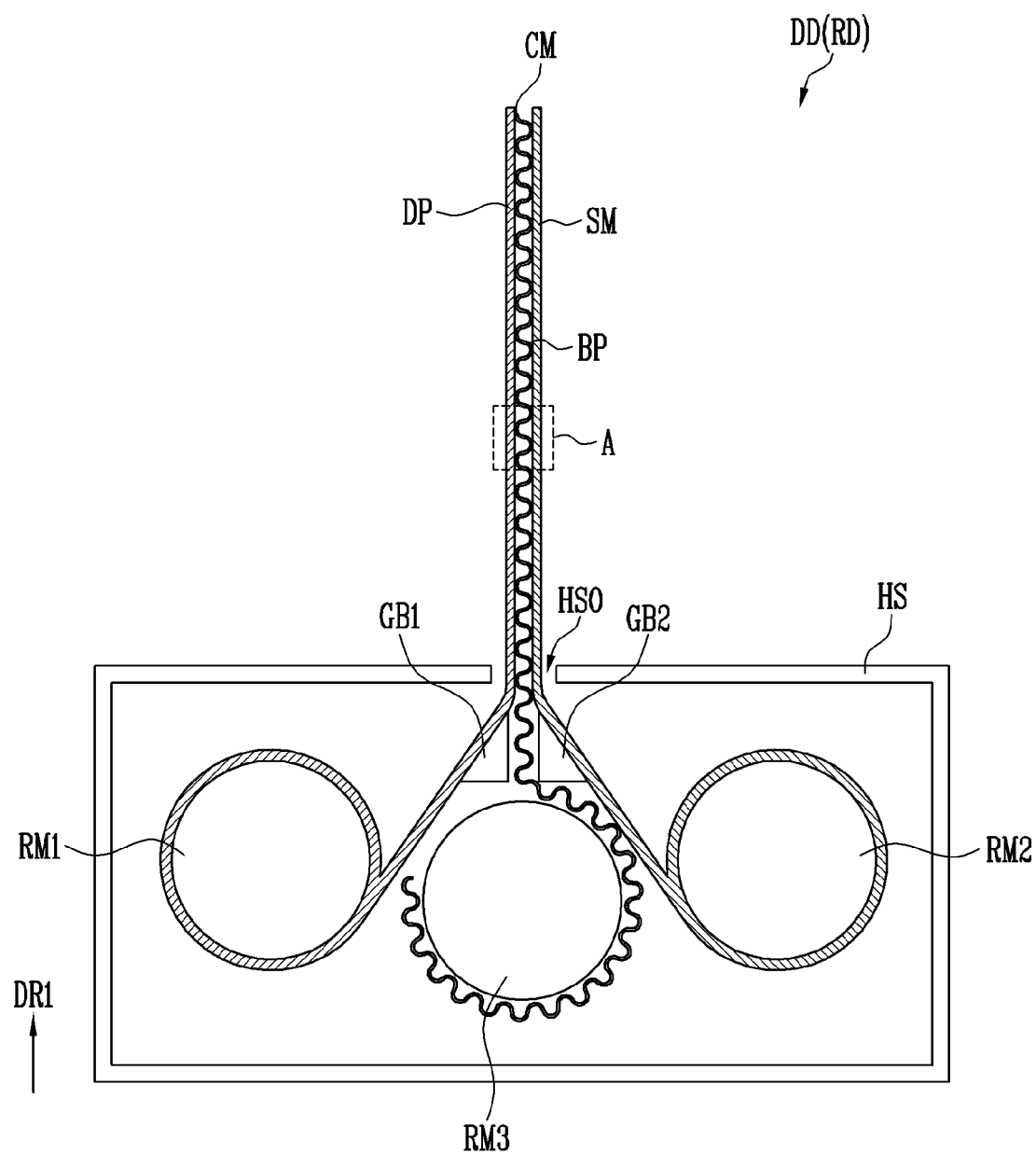
FIG. 6 is a schematic side view illustrating a display device in accordance with an embodiment.
Figure 7:
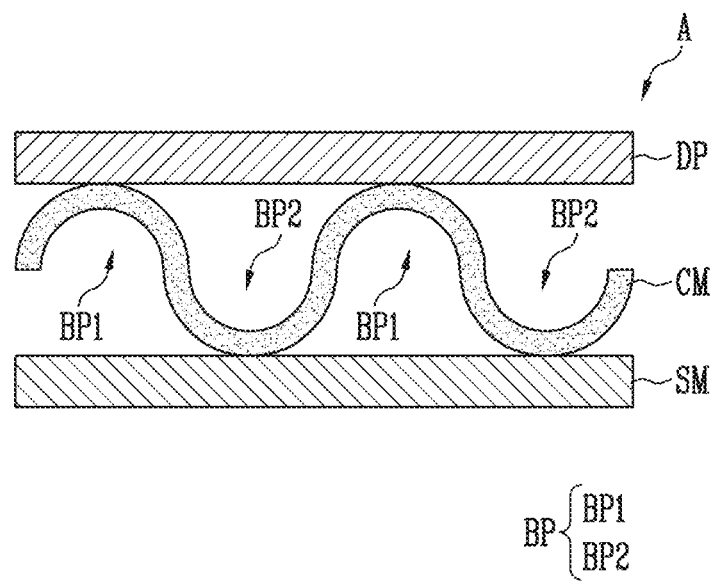
FIGS. 7, 8, and 9 are schematic enlarged cross-sectional views of area A shown in FIG. 6.
Figure 8:
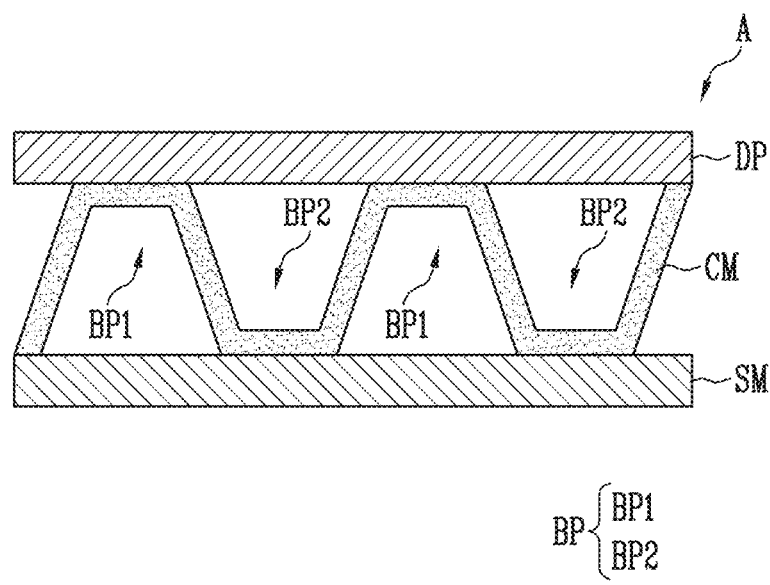
Figure 9:
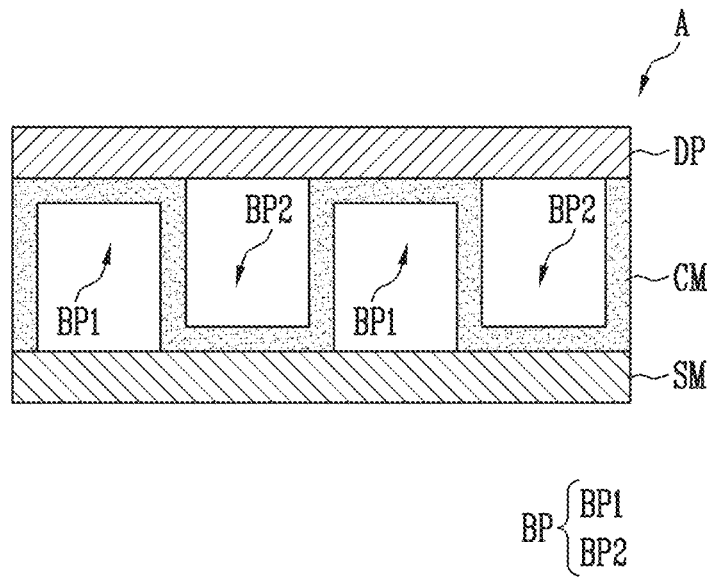
Figure 10:
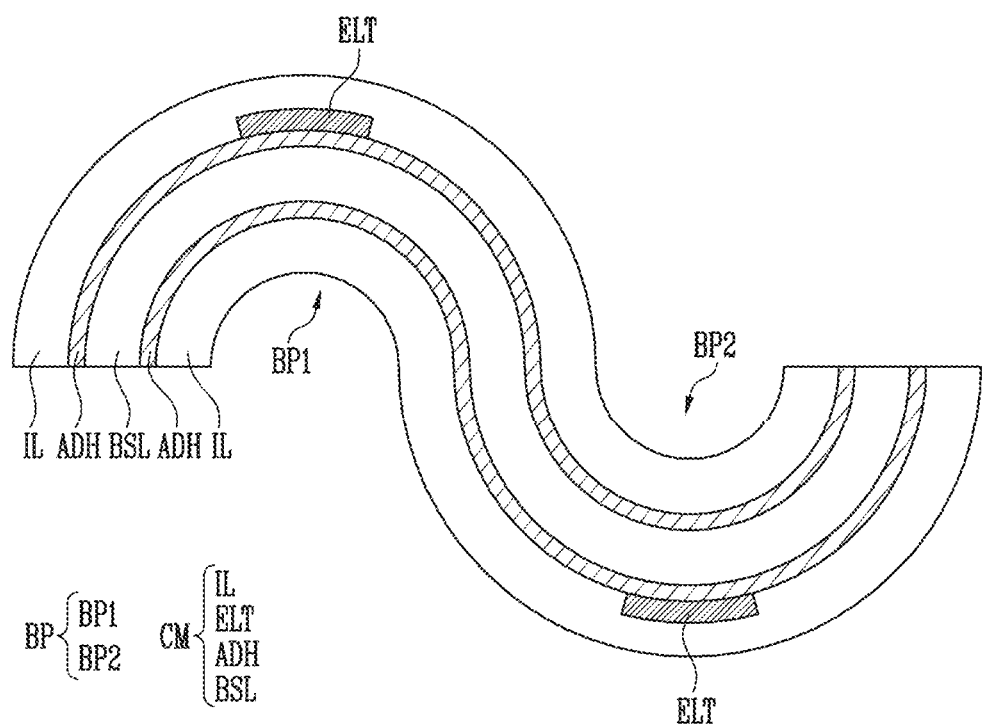
FIG. 10 is a schematic cross-sectional view illustrating a central member in accordance with an embodiment.

FIG. 6 is a schematic side view illustrating a display device in accordance with an embodiment. FIGS. 7, 8, and 9 are schematic enlarged cross-sectional views of area A shown in FIG. 6. FIG. 10 is a schematic cross-sectional view illustrating a central member in accordance with an embodiment.

Referring to FIGS. 1 to 10, the display device DD may include a support member SM, a central member CM, a first rotating member RM1, a second rotating member RM2, a third rotating member RM3, a first guide bar GB1, and/or a second guide bar GB2.

For example, each of the first, second, and third rotating members RM1, RM2, and RM3 may have a cylinder shape extending, e.g., in the second direction DR2. For example, the sections of the first, second, and third rotating members RM1, RM2, and RM3 may have a circle shape having the same size or different sizes (e.g., diameters). However, embodiments are not limited thereto. For example, the sections of the first, second, and third rotating members RM1, RM2, and RM3 may have various shapes (e.g., a ring, a polygon, or an ellipse).

For example, each of the first and second guide bars GB1 and GB2 may have a cylinder shape extending, e.g., in the second direction DR2. For example, the sections of the first and second guide bars GB1 and GB2 may have a triangle shape (e.g., a right triangle). However, embodiments are not limited thereto. For example, the sections of the first and second guide bars GB1 and GB2 may have various shapes (e.g., regular polygons or irregular polygons). For example, the longest side of the first guide bar GB1 may face (or be adjacent to) the display panel DP, which is separated from the central member CM, and the other side of the first guide bar GB1 may face (or be adjacent to) the central member CM, which is separated from the display panel DP and the support member SM. The longest side of the second guide bar GB2 may face (or be adjacent to) the support member SM, which is separated from the central member CM, and the other side of the second guide bar GB2 may face (or be adjacent to) the central member CM, which is separated from the display panel DP and the support member SM.

The support member SM may support the display panel DP. The support member SM may have flexibility. In an example, the support member SM may have a rolling characteristic. Accordingly, in case that the display device DD is in the closed mode, the support member SM may be rolled, to be accommodated inside the housing HS. In case that the display device DD is in the open mode, the support member SM may be unrolled in the opposite direction of the direction in which the support member SM is rolled, to be unrolled in a direction from the housing HS. The slot HSO of the housing HS may be a path for rolling (or winding) and unrolling (or unwinding) of the support member SM. In an example, the support member SM may be rolled inside the housing HS through the slot HSO of the housing HS, or be unrolled to the outside of the housing HS (e.g., the first direction DR1) through the slot HSO of the housing HS.

The support member SM may be coupled to the display panel DP in a process in which the support member SM is unrolled from the housing HS. In an example, the support member SM may be coupled to the display panel DP through the central member CM which will be described later. Also, the support member SM may be separated from the display panel DP in a process in which the support member SM is rolled, to be accommodated inside housing HS.

The support member SM may be changed from a state in which the support member SM is rolled (e.g., completely rolled) to a state in which the support member SM is unrolled (e.g., completely unrolled), or be changed from the state in which the support member SM is unrolled (e.g., completely unrolled) to the state in which the support member SM is rolled (e.g., completely rolled). In some embodiments, the support member SM may be changed from the state in which the support member SM is rolled (e.g., completely rolled) to a state in which only a portion of the support member SM is unrolled. The state in which only a portion of the support member SM is unrolled may mean a state in which the portion of the support member SM is disposed at the outside of the housing HS.

The support member SM may be formed in a shape corresponding to a shape of the display panel DP. In an example, the support member SM may be formed in a rectangular plate shape having two pairs of sides parallel to each other, but embodiments are not limited thereto. In case that the support member SM is formed in the rectangular plate shape, one pair among the two pairs of sides may be longer that the other pair of sides.

The support member SM may be connected to the second rotating member RM2 to be rolled on the second rotating member RM2. In some embodiments, a portion of the support member SM may be accommodated in the second rotating member RM2 or be coupled (e.g. physically coupled) to the second rotating member RM2. The support member SM may be rolled (e.g., entirely rolled) with a constant curvature.

The second rotating member RM2 may be accommodated in the housing HS to roll and/or unroll the support member SM. The second rotating member RM2 may be coupled to an end portion of the support member SM. A rotating operation of the second rotating member RM2 may be performed by a rotational force generated from a motor accommodated inside the housing HS. In case that the second rotating member RM2 is rotated in a direction (or a first rotational direction), the support member SM may be unrolled from the second rotating member RM2. In case that the second rotating member RM2 is rotated in the other direction (or a second rotational direction), the support member SM may be rolled on the second rotating member RM2.

The central member CM may be located between the display panel DP and the support member SM. The central member CM may function to couple the display panel DP and the support member SM to each other. The central member CM may have flexibility. In an example, the central member CM may have a rolling characteristic. Accordingly, in case that the display device DD is in the closed mode, the central member CM may be rolled, to be accommodated inside the housing HS. In case that the display device DD is in the open mode, the central member CM may be unrolled (or unwound) in the opposite direction of the direction in which the central member CM is rolled, to be unrolled in a direction from the housing HS. The slot HSO of the housing HS may be a path for rolling (or winding) and unrolling (or unwinding) of the central member CM. In an example, the central member CM may be rolled inside the housing through the slot HSO of the housing HS, or be unrolled to the outside of the housing HS (e.g., the first direction DR1) through the slot HSO of the housing HS.

The central member CM may be coupled to the display panel DP and/or the support member SM in a process in which the central member CM is unrolled from the housing HS. Also, the central member may be separated from the display panel DP and/or the support member SM in a process in which the central member CM is rolled, to be accommodated inside housing HS.

The central member CM may be changed from a state in which the central member CM is rolled (e.g., completely rolled) to a state in which the central member CM is unrolled (e.g., completely unrolled), or be changed from the state in which the central member CM is unrolled (e.g., completely unrolled) to the state in which the central member CM is rolled (e.g., completely rolled). In some embodiments, the central member CM may be changed from the state in which the central member CM is rolled (e.g., completely rolled) to a state in which only a portion of the central member CM is unrolled. The state in which only a portion of the central member CM is unrolled may mean a state in which the portion of the central member CM is disposed at the outside of the housing HS.

The central member CM may be formed in a shape corresponding to a shape of the display panel DP and/or the support member SM. In an example, the central member CM may be formed in a rectangular plate shape having two pairs of sides parallel to each other, but embodiments are not limited thereto. In case that the central member CM is formed in the rectangular plate shape, at least one pair among the two pairs of sides may be longer that the other pair of sides.

The central member CM may be connected to the third rotating member RM3, to be rolled on the third rotating member RM3. In some embodiments, a portion of the central member CM may be accommodated in the third rotating member RM3 or be coupled (e.g., physically coupled) to the third rotating member RM3. The central member CM may be rolled (e.g., entirely rolled) with a constant curvature.

The third rotating member RM3 may be accommodated in the housing HS to roll and/or unroll the central member CM. In an example, the third rotating member RM3 may be located between the first rotating member RM1 and the second rotating member RM2. The third rotating member RM3 may be coupled to an end portion of the central member CM. A rotating operation of the third rotating member RM3 may be performed by a rotational force generated from a motor accommodated inside the housing HS. In case that the third rotating member RM3 is rotated in a direction (or a first rotational direction), the central member CM may be rolled on the third rotating member RM3. In case that the third rotating member RM3 is rotated in the other direction (or a second rotational direction), the central member CM may be unrolled from the third rotating member RM3.

The central member CM may have elasticity. In an example, the central member CM may include a bending part BP in the form of a continuous bending part. The bending part BP may include a first bending part BP1 coupled to the display panel DP and a second bending part BP2 coupled to the support member SM. The first bending part BP1 and the second bending part BP2 may be alternately arranged. In an embodiment, the bending part BP of the central member CM may have a wave shape or a shape bent in an S-form as shown in FIG. 7. In another example, the bending part BP of the central member CM may have a shape bent in a trapezoidal form as shown in FIG. 8. In another example, the bending part BP of the central member CM may have a shape bent in a rectangular form as shown in FIG. 9. However, embodiments are not limited thereto, and the bending shape of the central member CM may be variously changed.

In an embodiment, the first bending part BP1 and the display panel DP may be coupled to each other by an electrostatic force. For example, the second bending part BP2 and the support member SM may be coupled to each other by an electrostatic force. For example, the central member CM may include an electrode layer ELT disposed in the bending part BP. In an example, as shown in FIG. 10, the central member CM may include the electrode layer ELT disposed on a base layer BSL. An adhesive layer ADH may be disposed between the base layer BSL and the electrode layer ELT. An insulating layer IL may be disposed on the electrode layer ELT. The base layer BSL may include polyimide having an excellent material property such as a heat-resisting property or an insulating property. The electrode layer ELT may include a conductive material such as copper (Cu), aluminum (Al), gold (Au), silver (Ag), platinum (Pt), titanium (Ti), and/or molybdenum (Mo). The insulating layer IL may include polyimide, but embodiments are not limited thereto. Accordingly, an electrostatic force may be formed by potentials charged in the electrode layer ELT disposed in the bending part BP, and the display panel DP and/or the support member SM, so that the bending part BP may be coupled to the display panel DP and/or the support member SM.

As described above, in case that the central member CM coupling the display panel DP and the support member SM to each other is formed to have the bending part BP, the central member CM may support a load of the display panel DP and maintain the center portion of the display panel DP in a process in which the display panel DP is rolled and unrolled, thereby preventing or minimizing shape deformation.

Thus, a phenomenon, which the display panel DP is rolled due to momentum of inertia in an unrolling process that the display panel DP is unrolled, may be effectively prevented or minimized. For example, a standing characteristic (e.g., ability of maintaining a state in which the display panel DP is unrolled), may be improved.

For example, a portion at which the central member CM is coupled to the display panel DP may be implemented as the bending part BP, so that dividing structures for coupling or supporting of the display panel DP, and the like may be omitted. Thus, fine bending, fine lines, and damage of the display panel DP due to dividing structures of a coupling member or a support member may be prevented.

The first guide bar GB1 may be disposed between the first rotating member RM1 and the second rotating member RM2 (e.g., in the third direction DR3). The first guide bar GB1 may be disposed over (or overlap) the third rotating member RM3 (e.g., in the first direction DR1). The first guide bar GB1 may guide a moving direction of the display panel DP and/or the central member CM in a process in which the display panel DP and/or the central member CM are unrolled. Also, the first guide bar GB1 may guide an operation in which the display panel DP and the central member CM are separated from each other, and prevent the display panel DP and the central member CM from being again coupled to each other by an electrostatic force. In an example, a portion of the display panel DP and a portion of the central member CM, which face the first guide bar GB1 interposed therebetween, may be separated from each other by the first guide bar GB1. The first guide bar GB1 may be located in the housing HS.

The second guide bar GB2 may be disposed between the first rotating member RM1 and the second rotating member RM2 (e.g., in the third direction DR3). The second guide bar GB2 may be disposed over (or overlap) the third rotating member RM3 (e.g., in the first direction DR1). The second guide bar GB2 may guide a moving direction of the support member SM and/or the central member CM in a process in which the support member SM and/or the central member CM are unrolled. Also, the second guide bar GB2 may guide an operation in which the support member SM and the central member CM are separated from each other, and prevent the support member SM and the central member CM from being again coupled to each other by an electrostatic force. In an example, a portion of the support member SM and a portion of the central member CM, which face the second guide bar GB2 interposed therebetween, may be separated from each other by the second guide bar GB2. The second guide bar GB2 may be located in the housing HS.

Hereinafter, some embodiments will be described. In the following embodiments, components identical to those which have already described are designated by like reference numerals, and overlapping descriptions will be omitted or simplified for descriptive convenience.

Figure 11:
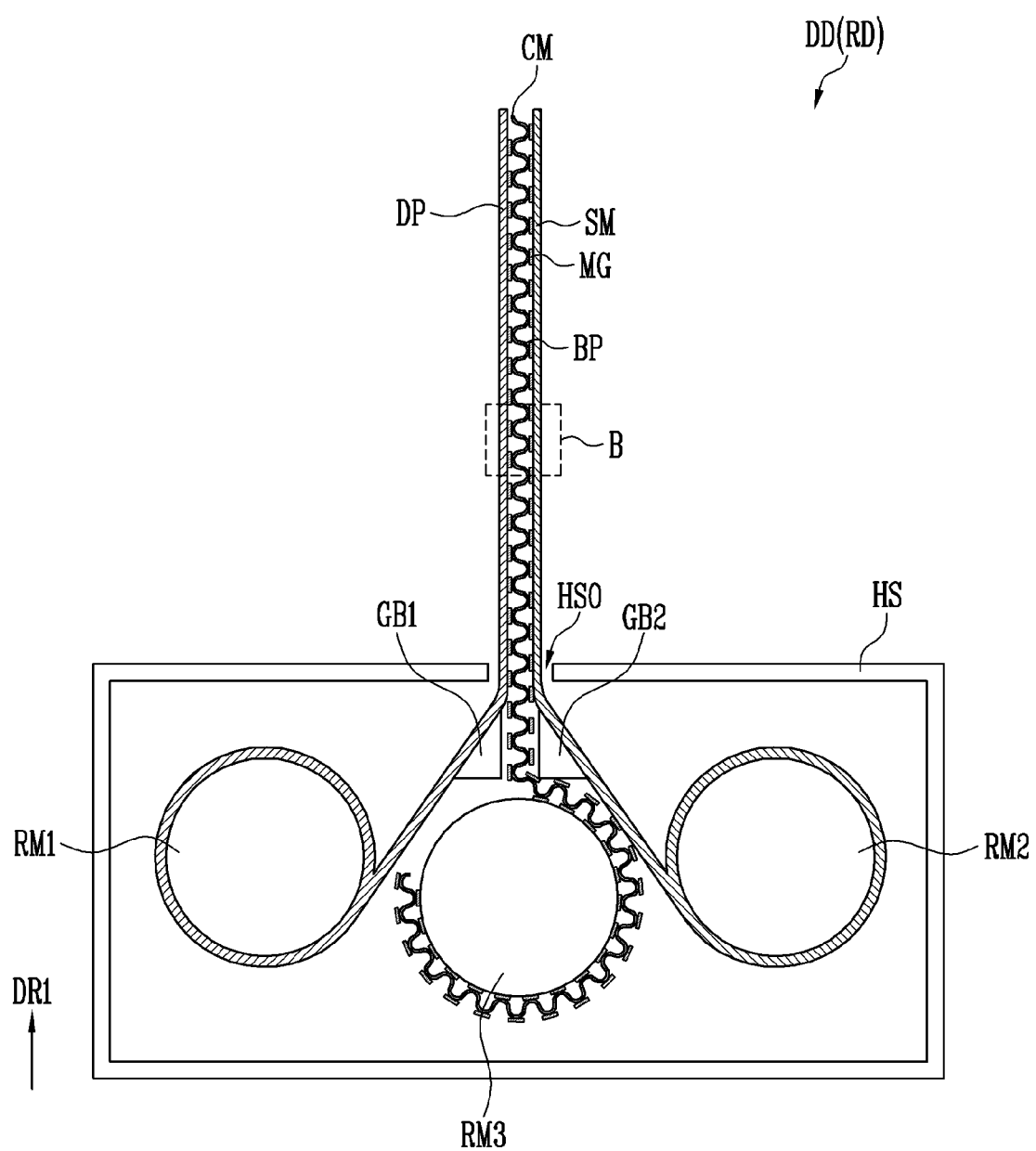
FIG. 11 is a schematic side view illustrating a display device in accordance with an embodiment.
Figure 12:
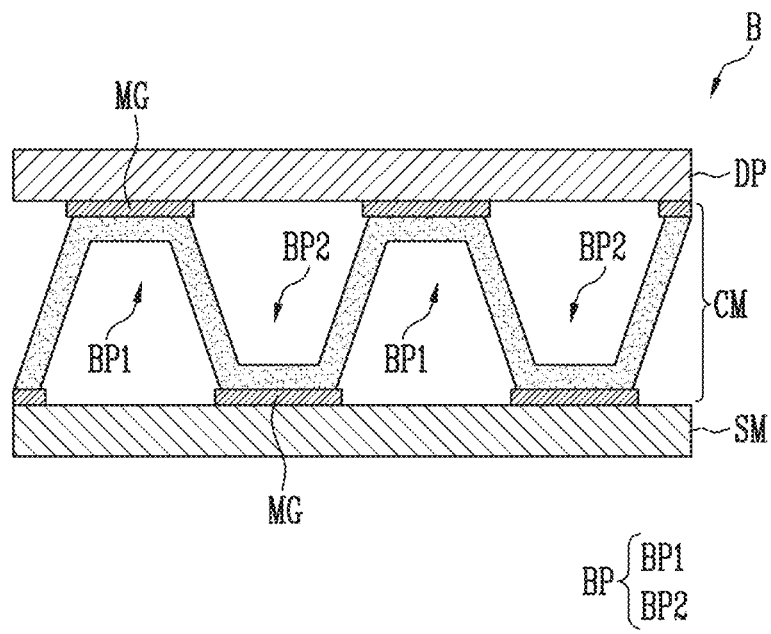
FIGS. 12, 13, and 14 are schematic enlarged cross-sectional views of area B shown in FIG. 11.
Figure 13:
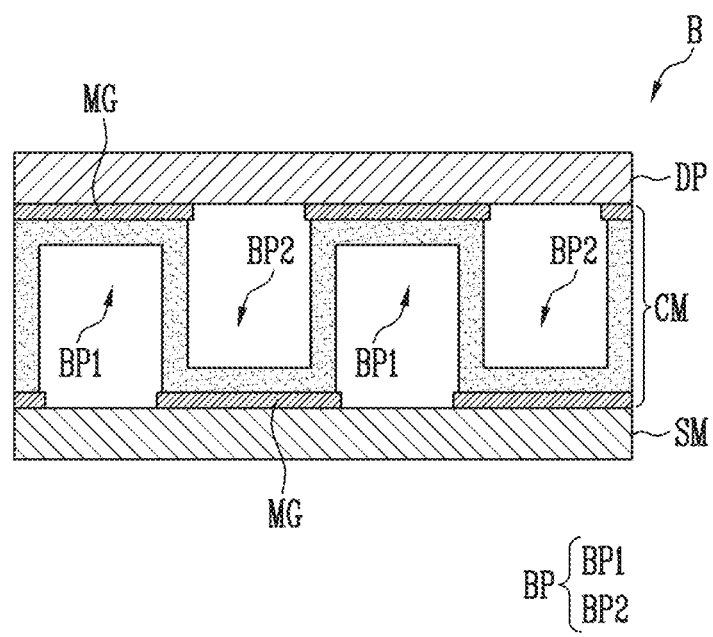
Figure 14:
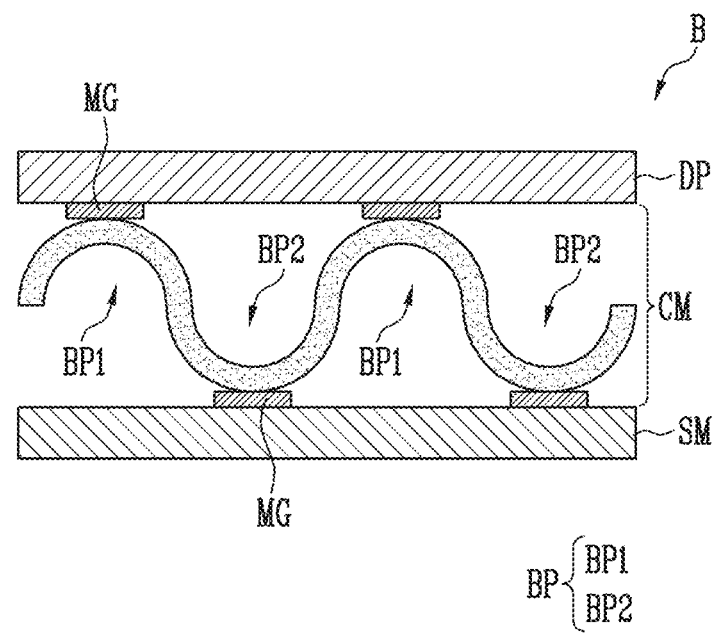
Figure 15:
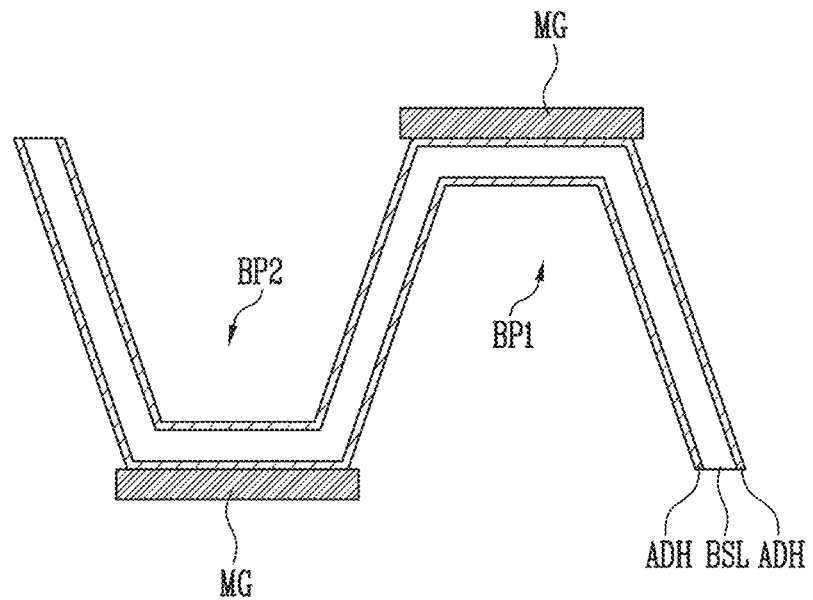
FIG. 15 is a schematic cross-sectional view illustrating a central member in accordance with an embodiment.

FIG. 11 is a schematic side view illustrating a display device in accordance with an embodiment. FIGS. 12, 13, and 14 are schematic enlarged cross-sectional views of area B shown in FIG. 11. FIG. 15 is a schematic cross-sectional view illustrating a central member in accordance with an embodiment.

Referring to FIGS. 11 and 15, the central member CM may include a magnet structure MG located at the bending part BP. In an example, the central member CM may include the magnet structure MG disposed on the base layer BSL. The adhesive layer ADH may be disposed between the base layer BSL and the magnet structure MG. Therefore, in case that the magnet structure MG is disposed at the bending part BP, the first bending part BP1 and the display panel DP may be coupled to each other by a magnetic force. For example, the second bending part BP2 and the support member SM may be coupled to each other by a magnetic force. In an embodiment, the bending part BP of the central member CM may have a shape bent in a trapezoidal form as shown in FIG. 12. In another example, the bending part BP of the central member CM may have a shape bent in a rectangular form as shown in FIG. 13. In another example, the bending part BP of the central member CM may have a wave shape or a shape bent in an S-form as shown in FIG. 14. However, embodiments are not limited thereto, and the bending shape of the central member CM may be variously changed.

As described above, in case that the central member CM coupling the display panel DP and the support member SM to each other is formed to have the bending part BP, the central member CM may support a load of the display panel DP and maintain the center portion of the display panel DP in a process in which the display panel DP is rolled and unrolled, thereby prevented or minimizing shape deformation. Thus, a phenomenon, which the display panel DP is rolled due to momentum of inertia in an unrolling process that the display panel DP is unrolled, may be effectively prevented or minimized. For example, a standing characteristic (e.g., ability of maintaining a state in which the display panel DP is unrolled) may be improved.

For example, a portion at which the central member CM is coupled to the display panel DP may be implemented as the bending part BP, so that dividing structures for coupling or supporting of the display panel DP, and the like may be omitted. Thus, fine bending, fine lines, and damage of the display panel DP due to dividing structures of a coupling member or a support member may be prevented, which has been described above.

Figure 16:
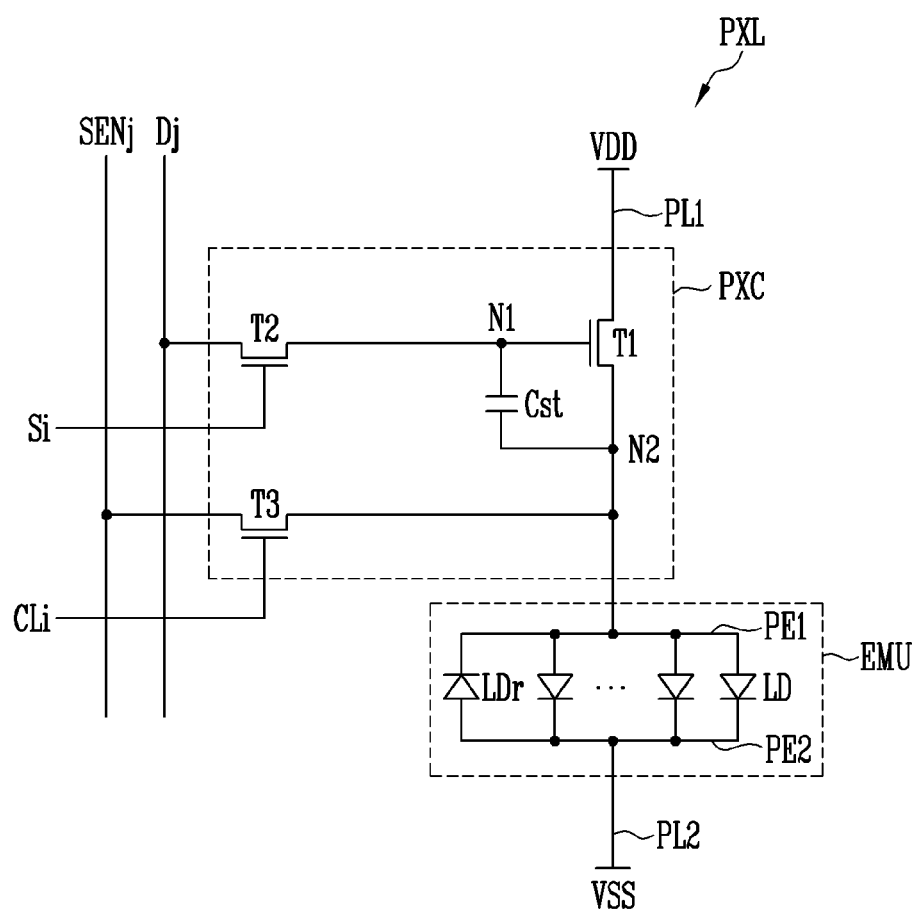
FIG. 16 is a schematic diagram of an equivalent circuit of a pixel in accordance with an embodiment of the disclosure.

FIG. 16 is a schematic diagram of an equivalent circuit of a pixel in accordance with an embodiment.

FIG. 16 is a circuit diagram illustrating an electrical connection relationship of components included in the pixel shown in FIG. 5. For example, FIG. 16 illustrates an electrical connection relationship between components included in a pixel PXL which may be provided to an active matrix type display device. However, the electrical connection relationship between the components included in the pixel PXL is not limited thereto.

Referring to FIGS. 5 and 16, the pixel PXL may include a light emitting unit EMU (or a light emitting part) which generates light with a luminance corresponding to a data signal. Also, the pixel PXL may include a pixel circuit PXC for driving the light emitting unit EMU.

In some embodiments, the light emitting unit EMU may include light emitting elements LD connected in parallel between a first power line PL1 connected to a first driving power source VDD to be applied with a voltage of the first driving power source VDD and a second power line PL2 connected to a second driving power source VSS to be applied with a voltage of the second driving power source VSS. For example, the light emitting unit EMU may include a first pixel electrode PE1 connected to the first driving power source VDD via the pixel circuit PXC and the first power line PL1, a second pixel electrode PE2 connected to the second driving power source VSS through the second power line PL2, and light emitting elements LD connected in parallel in the same direction between the first and second pixel electrodes PE1 and PE2. In an embodiment, the first pixel electrode PE1 may be an anode, and the second pixel electrode PE2 may be a cathode.

Each of the light emitting elements LD included in the light emitting unit EMU may include an end portion connected to the first driving power source VDD through the first pixel electrode PE1 and another end portion connected to the second driving power source VSS through the second pixel electrode PE2. The first driving power source VDD and the second driving power source VSS may have different potentials. In an example, the first driving power source VDD may be set as a high-potential power source, and the second driving power source VSS may be set as a low-potential power source. A potential difference between the first and second driving power sources VDD and VSS may be set equal to or higher than a threshold voltage of the light emitting elements LD during an emission period of the pixel PXL.

As described above, the light emitting elements LD connected in parallel in the same direction (e.g., a forward-bias direction) between the first pixel electrode PE1 and the second pixel electrode PE2, to which voltages having difference potentials are supplied, may form respective effective light sources.

Each of the light emitting elements LD of the light emitting unit EMU may emit light with a luminance corresponding to a driving current supplied through a corresponding pixel circuit PXC. For example, the pixel circuit PXC may supply, to the light emitting unit EMU, a driving current corresponding to a grayscale value of corresponding frame data during each frame period. The driving current supplied to the light emitting unit EMU may be divided to flow through each of the light emitting elements LD. Accordingly, the light emitting unit EMU may emit light with a luminance corresponding to the driving current in case that each light emitting element LD is emitting light with a luminance corresponding to a current flowing therethrough.

Although an embodiment in which the opposite end portions of the light emitting elements LD are connected in the same direction between the first and second driving power sources VDD and VSS has been described, but embodiments are not limited thereto. In some embodiments, the light emitting unit EMU may further include at least one ineffective light source, e.g., a reverse light emitting element LDr, in addition to the light emitting elements LD as the respective effective light sources. The reverse light emitting element LDr may be connected in parallel together with the light emitting elements LD as the effective light sources between the first and second pixel electrodes PE1 and PE2, and may be connected between the first and second pixel electrodes PE1 and PE2 in a direction (e.g., a reverse-bias direction) opposite to that in which the light emitting elements LD are connected. Although a driving voltage (e.g., a forward driving voltage as predetermined) is applied between the first and second pixel electrodes PE1 and PE2, the reverse light emitting element LDr may maintain an inactivated state, and accordingly, no current substantially flows through the reverse light emitting element LDr.

The pixel circuit PXC may be connected to a scan line Si and a data line Dj of the pixel PXL. Also, the pixel circuit PXC may be connected to a control line CLi and a sensing line SENj of the pixel PXL. In an example, in case that the pixel PXL may be disposed on an i-th row and a j-th column of the display area DA, the pixel circuit PXC of the pixel PXL may be connected an i-th scan line Si, a j-th data line Dj, an i-th control line CLi, and a j-th sensing line SENj of the display area DA.

The pixel circuit PXC may include first, second, and third transistors T1, T2, and T3 and a storage capacitor Cst.

The first transistor T1 may be a driving transistor for controlling a driving current applied to the light emitting unit EMU, and may be connected between the first driving power source VDD and the light emitting unit EMU. For example, a first terminal of the first transistor T1 may be connected (or coupled) to the first driving power source VDD through the first power line PL1, a second terminal of the first transistor T1 may be connected to a second node N2, and a gate electrode of the first transistor T1 may be connected to a first node N1. The first transistor T1 may control an amount of driving current applied to the light emitting unit EMU through the second node N2 from the first driving power source VDD according to a voltage applied to the first node N1. In an embodiment, the first terminal of the first transistor T1 may be a drain electrode, and the second terminal of the first transistor T1 may be a source electrode. However, embodiments are not limited thereto. In some embodiments, the first terminal may be the source electrode, and the second terminal may be the drain electrode.

The second transistor T2 may be a switching transistor which selects a pixel PXL in response to a scan signal and activates the pixel PXL, and may be connected between the data line Dj and the first node N1. A first terminal of the second transistor T2 may be connected to the data line Dj, a second terminal of the second transistor T2 may be connected to the first node N1, and a gate electrode of the second transistor T2 may be connected to the scan line Si. The first terminal and the second terminal of the second transistor T2 may be formed of different terminals. For example, in case that the first terminal is a drain electrode, the second terminal may be a source electrode.

The second transistor T2 may be turned on in case that a scan having a gate-on voltage (e.g., a high level voltage) is supplied from the scan line Si, to electrically connect the data line Dj and the first node N1 to each other. The first node N1 may be a point at which the second terminal of the second transistor T2 and the gate electrode of the first transistor T1 are connected to each other, and the second transistor T2 may transfer a data signal to the gate electrode of the first transistor T1.

The third transistor T3 may connect the first transistor T1 to the sensing line SENj, to sense or acquire a sensing signal through the sensing line SENj and to detect a characteristic of the pixel PXL, e.g., a threshold voltage of the first transistor, or the like, by using the sensing signal. Information on the characteristic of the pixel PXL may be used to convert image data such that a characteristic deviation between pixels PXL may be compensated. A second terminal of the third transistor T3 may be connected to the second terminal of the first transistor T1, a first terminal of the third transistor T3 may be connected to the sensing line SENj, and a gate electrode of the third transistor T3 may be connected to the control line CLi. Also, the first terminal of the third transistor T3 may be connected to an initialization power source. The third transistor T3 may be an initialization transistor capable of initializing the second node N2. The third transistor T3 may be turned on in case that a sensing control signal is supplied from the control line CLi, to transfer a voltage of the initialization power source to the second node N2. Accordingly, a second storage electrode of the storage capacitor Cst, which is connected to the second node N2, may be initialized.

A first storage electrode of the storage capacitor Cst may be connected to the first node N1, and the second storage electrode of the storage capacitor Cst may be connected to the second node N2. The storage capacitor Cst charges a data voltage corresponding to the data signal supplied to the first node N1 during one frame period. Accordingly, the storage capacitor Cst may store a voltage corresponding to the difference between a voltage of the gate electrode of the first transistor T1 and a voltage of the second node N2.

Although an embodiment in which the light emitting elements LD of the light emitting unit EMU are all connected in parallel has been illustrated in FIG. 16, embodiments are not limited thereto. In some embodiments, the light emitting unit EMU may include at least one serial stage (or a stage) including light emitting elements LD connected in parallel to each other. For example, the light emitting unit EMU may be formed in a series/parallel hybrid structure.

Figure 17:
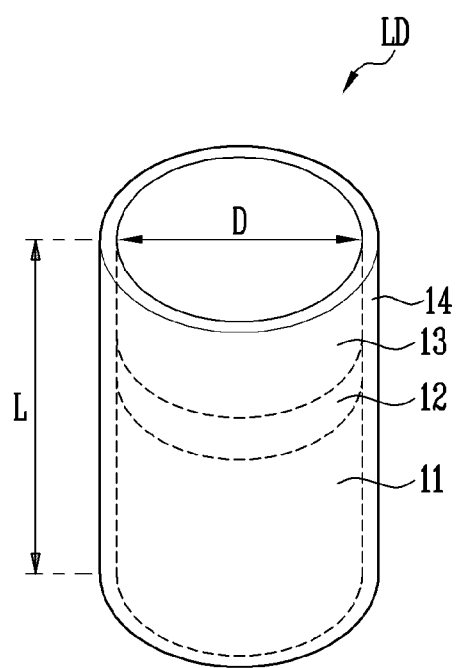
FIG. 17 is a schematic perspective view schematically illustrating a light emitting element included in the pixel in accordance with an embodiment.

FIG. 17 is a schematic perspective view schematically illustrating a light emitting element included in the pixel in accordance with an embodiment.

In an embodiment, the kind and/or shape of the light emitting element LD is not limited to the embodiment shown in FIG. 17.

Referring to FIG. 17, the light emitting element LD may include a first semiconductor layer 11, a second semiconductor layer 13, and an active layer 12 interposed between the first and second semiconductor layers 11 and 13. In an example, the light emitting element LD may be implemented as a light emitting stack structure (or a stack pattern) in which the first semiconductor layer 11, the active layer 12, and the second semiconductor layer 13 are sequentially stacked.

The light emitting element LD may be formed in a shape extending in a direction. In case that assuming that an extending direction of the light emitting element LD is a length direction, the light emitting element LD may include a first end portion and a second end portion along the length direction. At least one of the first and second semiconductor layers 11 and 13 may be disposed at the first end portion of the light emitting element LD, and the other of the first and second semiconductor layers 11 and 13 may be disposed at the second end portion of the light emitting element LD. In an example, the first semiconductor layer 11 may be disposed at the first end portion of the light emitting element LD, and the second semiconductor layer 13 may be disposed at the second end portion of the light emitting element LD.

The light emitting element LD may be formed in various shapes. In an example, the light emitting element LD may have a rod-like shape, a bar-like shape, a pillar-like shape, or the like, which is long in the length direction to have an aspect ratio, which is greater than 1, as shown in FIG. 17. In another example, the light emitting element LD may have a rod-like shape, a bar-like shape, a pillar-like shape, or the like, which is short in the length direction to have an aspect ratio that is smaller than 1. In still another example, the light emitting element LD may have a rod-like shape, a bar-like shape, a pillar-like shape, or the like, of which aspect ratio is 1.

The light emitting element LD may include, for example, a light emitting diode (LED) manufactured small enough to have a diameter D and/or a length L to a degree of nano scale (or nanometer) to micrometer scale (or micrometer).

In case that the light emitting element LD is long in the length direction to have an aspect ratio, which is greater than 1, the diameter D of the light emitting element LD may be about 0.5 µm to about 6 µm, and the length L of the light emitting element LD may be about 1 µm to about 10 µm. However, the diameter D and the length L of the light emitting element LD are not limited thereto, and the size of the light emitting element LD may be changed according to requirement conditions (or design conditions) of a lighting device or a self-luminous display device, to which the light emitting element LD is applied.

The first semiconductor layer 11 may include, for example, at least one n-type semiconductor layer. For example, the first semiconductor layer 11 may include at least one semiconductor material among InAlGaN, GaN, AlGaN, InGaN, AlN, and InN, and include an n-type semiconductor layer doped with a first conductive dopant (or an n-type dopant) such as Si, Ge or Sn. However, the material of the first semiconductor layer 11 is not limited thereto. For example, the first semiconductor layer 11 may be formed of various materials. The first semiconductor layer 11 may include an upper surface in contact with the active layer 12 and a lower surface exposed to the outside along the length direction of the light emitting element LD. The lower surface of the first semiconductor layer 11 may be the end portion (or a lower end portion) of the light emitting element LD.

The active layer 12 may be formed on the first semiconductor layer 11, and may be formed in a single quantum well structure or a multiple quantum well structure. In an example, in case that the active layer 12 is formed in the multiple quantum well structure, a barrier layer, a strain reinforcing layer, and a well layer, which constitute one unit, may be periodically and repeatedly stacked in the active layer 12. The strain reinforcing layer may have a lattice constant smaller than that of the barrier layer, to further reinforce strain, e.g., compressive strain applied to the well layer. However, the structure of the active layer 12 is not limited thereto.

The active layer 12 may emit light having a wavelength of about 400 nm to about 900 nm, and use a double hetero structure. In an embodiment, a clad layer doped with a conductive dopant may be formed on the top and/or the bottom (or the upper and/or the lower) of the active layer 12 along the length direction of the light emitting element LD. In an example, the clad layer may be formed as an AlGaN layer or an InAlGaN layer. In some embodiments, a material such as AlGaN or AlInGaN may be used to form the active layer 12. For example, the active layer 12 may be formed of various materials. The active layer 12 may include a first surface in contact with the first semiconductor layer 11 and a second surface in contact with the second semiconductor layer 13.

In case that an electric field having a voltage (e.g., a predetermined voltage) or more is applied to the opposite end portions of the light emitting element LD, the light emitting element LD may emit light by the combination of electron-hole pairs in the active layer 12. The light emission of the light emitting element LD may be controlled by using such a principle, so that the light emitting element LD may be used as a light source (or a light emitting source) for various light emitting devices, including a pixel of a display device.

The second semiconductor layer 13 may be formed on the second surface of the active layer 12, and may include a semiconductor layer having a type different from that of the first semiconductor layer 11. In an example, the second semiconductor layer 13 may include at least one p-type semiconductor material. For example, the second semiconductor layer 13 may include at least one semiconductor material among InAlGaN, GaN, AlGaN, InGaN, AlN, and InN, and include a p-type semiconductor layer doped with a second conductive dopant (or a p-type dopant) such as Mg, Zn, Ca, Sr or Ba. However, the material of the second semiconductor layer 13 is not limited thereto. For example, the second semiconductor layer 13 may be formed of various materials. The second semiconductor layer 13 may include a lower surface in contact with the second surface of the active layer 12 and an upper surface exposed to the outside along the length direction of the light emitting element LD. The upper surface of the second semiconductor layer 13 may be the other end portion (or an upper end portion) of the light emitting element LD.

In an embodiment, the first semiconductor layer 11 and the second semiconductor layer 13 may have different thicknesses in the length direction of the light emitting element LD. In an example, the first semiconductor layer 11 may have a thickness relatively thicker than that of the second semiconductor layer 13 along the length direction of the light emitting element LD. Accordingly, the active layer 12 of the light emitting element LD may be located more adjacent (or closer) to the upper surface of the second semiconductor layer 13 than the lower surface of the first semiconductor layer 11.

Although it is illustrated that each of the first semiconductor layer 11 and the second semiconductor layer 13 is formed as a single layer, embodiments are not limited thereto. In an embodiment, each of the first semiconductor layer 11 and the second semiconductor layer 13 may further include at least one layer, e.g., a clad layer and/or a Tensile Strain Barrier Reducing (TSBR) layer according to the material of the active layer 12. The TSBR layer may be a strain reducing layer disposed between semiconductor layers having different lattice structures to perform a buffering function for reducing a lattice constant difference. The TSBR may be formed as a p-type semiconductor layer such as p-GAInP, p-AlInP or p-AlGaInP, but embodiments are not limited thereto.

In some embodiments, the light emitting element LD may further include a contact electrode (hereinafter, referred to as a "first contact electrode") disposed on the top of the second semiconductor layer 13, in addition to the first semiconductor layer 11, the active layer 12, and the second semiconductor layer 13, which are described above. In some embodiments, the light emitting element LD may further include another contact electrode (hereinafter, referred to as a "second contact electrode") disposed at an end portion of the first semiconductor layer 11.

Each of the first and second contact electrodes may be an ohmic contact electrode, but embodiments are not limited thereto. In some embodiments, each of the first and second contact electrodes may be a Schottky contact electrode. The first and second contact electrodes may include a conductive material. For example, the first and second contact electrodes may include an opaque metal using one or mixture of chromium (Cr), titanium (Ti), aluminum (Al), gold (Au), nickel (Ni), and any oxide or alloy thereof, but embodiments are not limited thereto. In some embodiments, the first and second contact electrodes may include a transparent conductive oxide such as indium tin oxide (ITO), indium zinc oxide (IZO), zinc oxide (ZnO), indium gallium zinc oxide (IGZO), or indium tin zinc oxide (ITZO).

Materials respectively included in the first and second contact electrodes may be identical to or different from each other. The first and second contact electrodes may be substantially transparent or translucent. Accordingly, light generated in the light emitting element LD may be emitted to the outside of the light emitting element LD by passing through the first and second contact electrodes. In some embodiments, in case that light generated in the light emitting element LD does not pass through the first and second contact electrodes and is emitted to the outside of the light emitting element LD through an area except the opposite end portions of the light emitting element LD, the first and second contact electrodes may include an opaque metal.

In an embodiment, the light emitting element LD may further include an insulative film 14 (or an insulating film). However, in some embodiments, the insulative film 14 may be omitted, and be provided to cover only portions of the first semiconductor layer 11, the active layer 12, and the second semiconductor layer 13.

The insulative film 14 may prevent an electrical short circuit which may occur in case that the active layer 12 is in contact with a conductive material in addition to the first semiconductor layer 11 and the second semiconductor layer 13. Also, the insulative film 14 may minimize a surface defect of the light emitting element LD, thereby improving the lifespan and light emission efficiency of the light emitting element LD. Also, in case that a plurality of light emitting elements LD are densely disposed, the insulative film 14 may prevent the short circuit which may occur between the light emitting elements LD. Whether the insulative film 14 is provided is not limited as long as the active layer 12 may prevent occurrence of a short circuit with external conductive material.

The insulative film 14 may be formed in a shape partially or entirely surrounding an outer circumferential surface of the light emitting stack structure including the first semiconductor layer 11, the active layer 12, and the second semiconductor layer 13.

Although a case where the insulative film 14 is formed in a shape partially or entirely surrounding an outer circumferential surface of each of the first semiconductor layer 11, the active layer 12, and the second semiconductor layer 13 is described in the above-described embodiment, embodiments are not limited thereto. In some embodiments, in case that the light emitting element LD includes the first contact electrode, the insulative film 14 may partially or entirely surround an outer circumferential surface of each of the first semiconductor layer 11, the active layer 12, the second semiconductor layer 13, and the first contact electrode. In some embodiments, the insulative film 14 may not entirely surround the outer circumferential surface of the first contact electrode, or may surround only a portion of the outer circumferential surface of the first contact electrode and may not surround the other of the outer circumferential surface of the first contact electrode. In some embodiments, in case that the first contact electrode is disposed at the other end portion (or an upper end portion) of the light emitting element LD and the second contact electrode is disposed at an end portion (or the other end portion) of the light emitting element LD, the insulative film 14 may expose at least one area of each of the first and second contact electrodes.

The insulative film 14 may include a transparent insulating material. The insulative film 14 may be in the form of a single layer or be in the form of a multi-layer including at least two layers. In an example, in case that the insulative film 14 is formed as a double layer including a first insulating layer and a second insulating layer, which are sequentially stacked, the first insulating layer and the second insulating layer may be made of different materials (or ingredients), and be formed through different processes. In some embodiments, the first insulating layer and the second insulating layer may be formed of the same material by a continuous process.

The above-described light emitting element LD may be used as a light emitting source (or a light source) for the display device DD. The light emitting element LD may be manufactured through a surface treatment process. For example, in case that a plurality of light emitting elements LD are mixed in a liquid solution (or solvent) to be supplied to each pixel area (e.g., an emission area of each pixel or an emission area of each sub-pixel), each light emitting element LD may be surface-treated such that the light emitting elements LD may not be unequally condensed in the solution but equally dispersed in the solution.

A light emitting unit (or a light emitting device) including the above-described light emitting element LD may be used in various types of devices that require a light source, including the display device DD. In case that a plurality of light emitting elements LD are disposed in an emission area of each pixel PXL of the display panel DP, the light emitting elements LD may be used as a light source of the pixel PXL. However, the application field of the light emitting element LD is not limited to the above-described example. For example, the light emitting element LD may be used for other types of electronic devices that require a light source, such as a lighting device.

Hereinafter, an embodiment of the pixel PXL using the above-described light emitting element LD as a light source will be described with reference to FIGS. 18 and 19.

Figure 18:
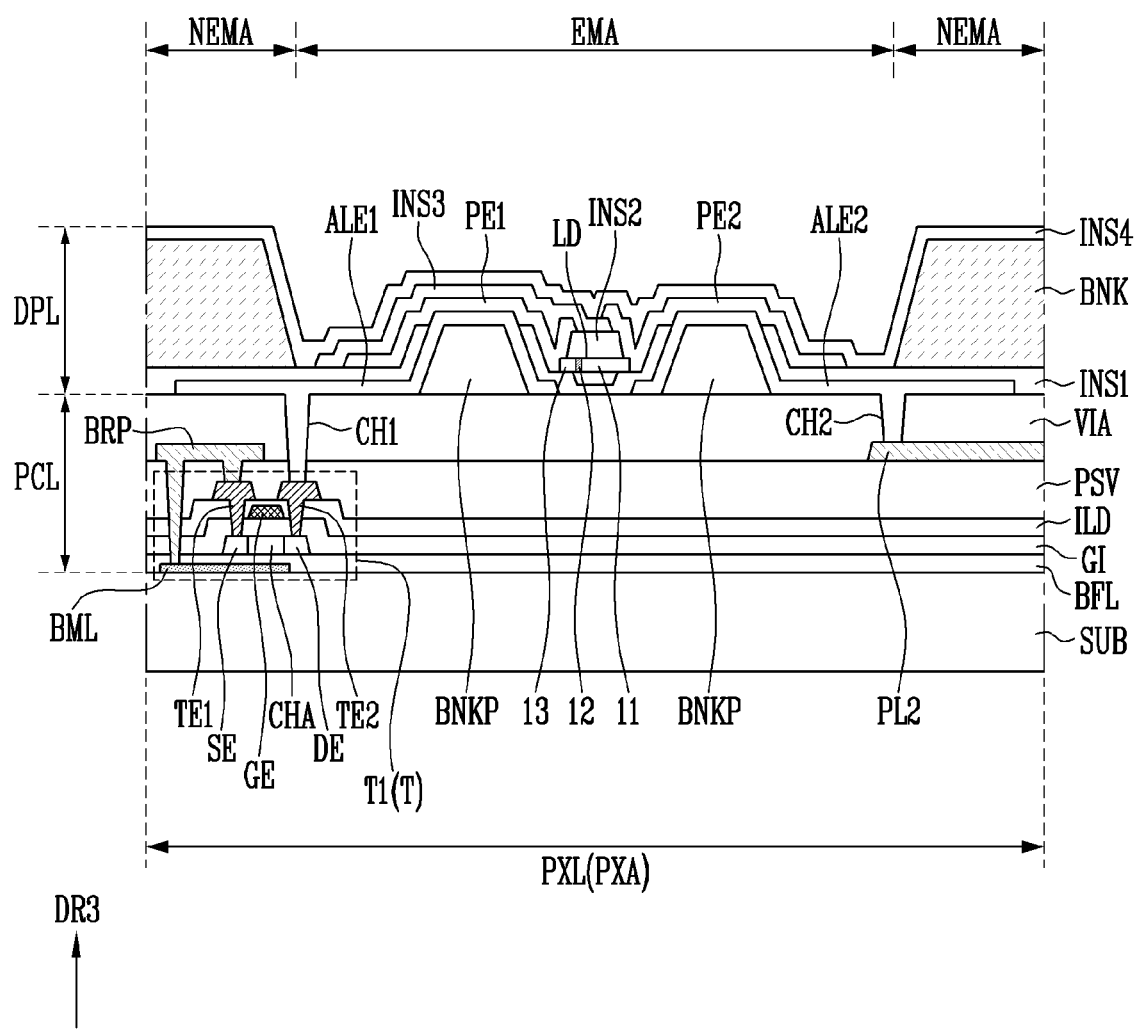
FIGS. 18 and 19 are schematic cross-sectional views illustrating a pixel in accordance with an embodiment.
Figure 19:
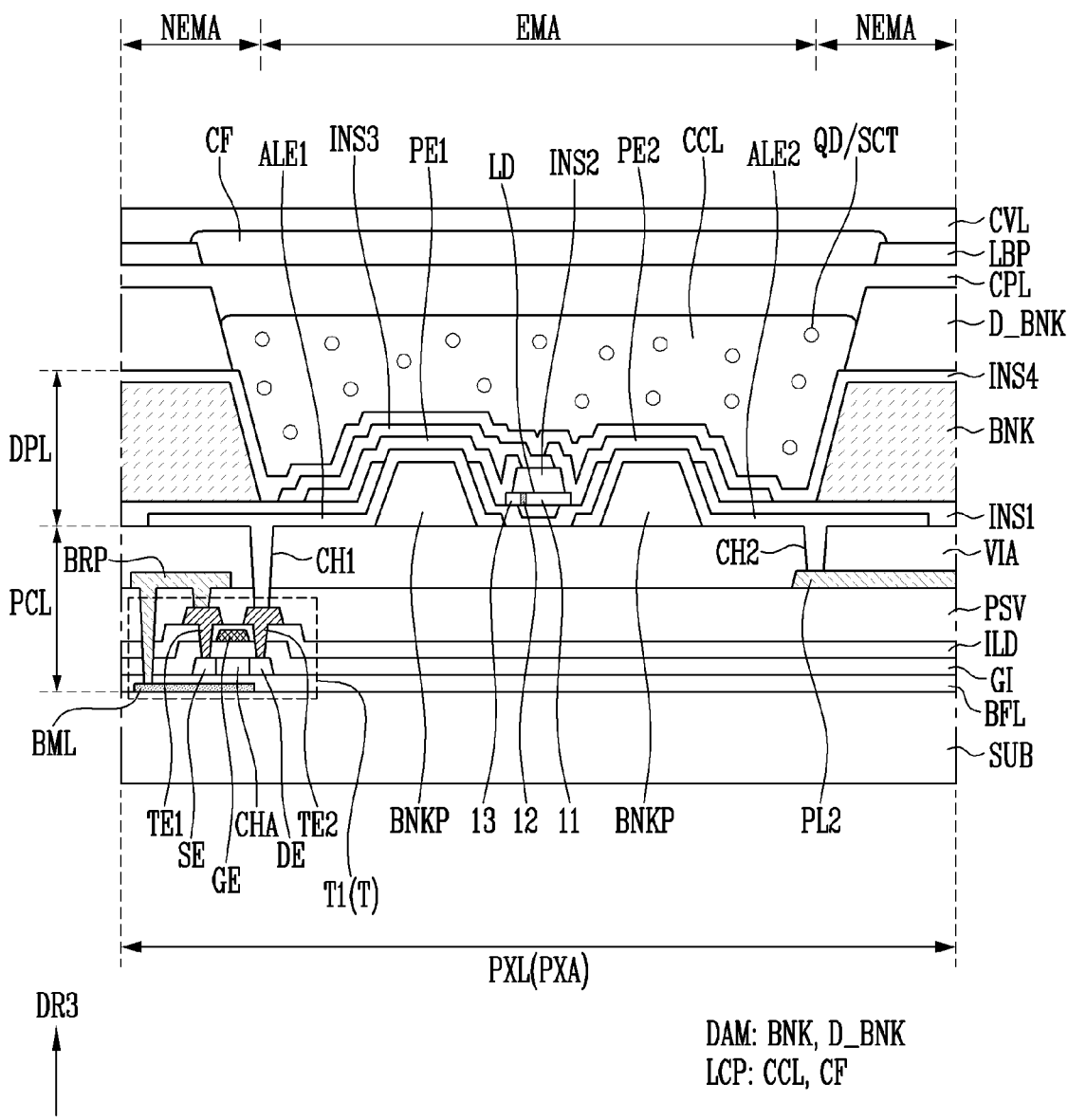

FIGS. 18 and 19 are schematic cross-sectional views illustrating a pixel in accordance with an embodiment.

FIG. 19 illustrates another example of the embodiment shown in FIG. 18.

In FIGS. 18 and 19, a pixel PXL is simplified and illustrated, such as that each electrode is illustrated as an electrode having a signal layer (or a single film) and each insulating layer is illustrated as an insulating layer formed as a single layer (or a single film), but embodiments are not limited thereto.

In FIGS. 18 and 19, a longitudinal direction (or a vertical direction) on a cross-section is represented as the third direction DR3.

For descriptive convenience, in FIGS. 18 and 19, the first transistor T1 corresponding to a driving transistor T among the first, second, and third transistors T1, T2, and T3 shown in FIG. 16 is illustrated as an example.

Referring to FIGS. 1 to 18, the pixel PXL may include the substrate SUB, a pixel circuit layer PCL, and a display element layer DPL. The pixel circuit layer PCL and the display element layer DPL may be disposed on a surface of the substrate SUB to overlap each other.

The substrate SUB may include a transparent insulating material capable of transmitting light therethrough. The substrate SUB may be a rigid substrate or a flexible substrate.

Circuit elements (e.g., transistors T) of a pixel circuit PXC of a pixel PXL and signal lines (e.g., predetermined signal lines) connected to the circuit elements may be disposed in a pixel area PXA in which the corresponding pixel PXL is disposed. For example, a light emitting element LD and first and second pixel electrodes PE1 and PE2, which form a light emitting unit EMU of the corresponding pixel PXL, may be disposed in the pixel area PXA. In an embodiment, the pixel area PXA may include an emission area EMA and a non-emission area NEMA.

The pixel circuit layer PCL may include at least one insulating layer in addition to the circuit elements and the signal lines. For example, the pixel circuit layer PCL may include a buffer layer BFL, a gate insulating layer GI, an interlayer insulating layer ILD, and a passivation layer PSV (or a via layer). Also, the pixel circuit layer PCL may include conductive layers disposed between the above-described insulating layers.

The buffer layer BFL may be partially or entirely provided and/or formed on the substrate SUB. The buffer layer BFL may prevent an impurity from being diffused or permeated into a transistor T included in the pixel circuit PXC. The buffer layer BFL may be an inorganic insulating layer including an inorganic material. The buffer layer BFL may include at least one of silicon nitride ($SiN_x$), silicon oxide ($SiO_x$), silicon oxynitride ($SiO_xN_y$), and metal oxide such as aluminum oxide ($AlO_x$). The buffer layer BFL may be formed in a single layer, but be formed in a multi-layer including at least two layers. In case that the buffer layer BFL is formed in the multi-layer, the layers may be formed of the same material or be formed of different materials. The buffer layer BFL may be omitted according to the material and process conditions of the substrate SUB.

The transistor T, a bridge pattern layer BRP, a lower line layer BML (or auxiliary line), and a power line (e.g., a predetermined power line) may be disposed on the buffer layer BFL.

The transistor T may include the first transistor T1 for controlling a driving current of the light emitting element LD.

The first transistor T1 may include an active pattern layer (or a semiconductor layer) and a gate electrode GE overlapping a portion of the active pattern layer. The active pattern layer may include a channel region CHA, a first contact region SE, and a second contact region DE.

The gate electrode GE may be provided and/or formed on the gate insulating layer GI. The gate electrode GE may be formed as a single layer including at least one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double- or multi-layered structure including molybdenum (Mo), titanium (Ti), copper (Cu), aluminum (Al) or silver (Ag), which is a low-resistance material so as to decrease wiring resistance.

The gate insulating layer GI may be partially or entirely provided and/or formed on the active pattern layer and the buffer layer BFL. The gate insulating layer GI may be an inorganic insulating layer including an inorganic material. In an example, the gate insulating layer GI may include at least one of silicon nitride ($SiN_x$), silicon oxide ($SiO_x$), silicon oxynitride ($SiO_xN_y$), and metal oxide such as aluminum oxide ($AlO_x$). However, the material of the gate insulating layer GI is not limited thereto. In some embodiments, the gate insulating layer GI may be an organic insulating layer including an organic material. The gate insulating layer GI may be formed as a single layer, but be formed as a multi-layer including at least two layers.

The active pattern layer may be formed of poly-silicon, amorphous silicon, an oxide semiconductor, or the like. Each of the channel region CHA, the first contact region SE, and the second contact region DE may be formed as a semiconductor layer doped or undoped with an impurity. In an example, each of the first contact region SE and the second contact region DE may be formed as a semiconductor layer doped with the impurity, and the channel region CHA may be formed as a semiconductor layer undoped with the impurity.

The channel region CHA of the first transistor T1 may be a region of the active pattern layer overlapping the gate electrode GE of the corresponding transistor T. In an example, the channel region CHA of the first transistor T1 may be a region of the active pattern layer overlapping the gate electrode GE of the first transistor T1.

The first contact region SE of the first transistor T1 may be connected to (or in contact with) an end portion of the channel region CHA. The first contact region SE of the first transistor T1 may be connected to a first connection member TE1.

The first connection member TE1 may be provided and/or formed on the interlayer insulating layer ILD. The first connection member TE1 may be electrically and/or physically connected to the first contact region SE of the first transistor T1 through a contact hole sequentially penetrating the interlayer insulating layer ILD and the gate insulating layer GI. In an embodiment, the first connection member TE1 connected to the first contact region SE of the first transistor T1 may be electrically and/or physically connected to the bridge pattern layer BRP through a contact hole the passivation layer PSV located on the interlayer insulating layer ILD.

The first connection member TE1 and the gate electrode GE may include the same material, or include at least one material selected from the materials of the gate electrode GE.

The interlayer insulating layer ILD may be partially or entirely provided and/or formed on the gate electrode GE and the gate insulating layer GI. The interlayer insulating layer ILD and the gate insulating layer GI may include the same material or include at least one material selected from the materials of the gate insulating layer GI.

The bridge pattern layer BRP may be provided and/or formed on the passivation layer PSV. The bridge pattern layer BRP may be connected to the first contact region SE of the first transistor T1 through the first connection member TE1. Also, the bridge pattern layer BRP may be electrically and/or physically connected to the lower line layer BML through a contact hole sequentially penetrating the passivation layer PSV, the interlayer insulating layer ILD, the gate insulating layer GI, and the buffer layer BFL. The lower line layer BML and the first contact region SE of the first transistor T1 may be electrically connected to each other through the bridge pattern layer BRP and the first connection member TE1.

The lower line layer BML may be a first conductive layer among conductive layers disposed on the substrate SUB. The lower line layer BML may be electrically connected to the first transistor T1, to widen the driving range of a voltage (e.g., a predetermined voltage) supplied to the gate electrode GE of the first transistor T1. In an example, the lower line layer BML may be electrically connected to the first contact region SE of the first transistor T1, to stabilize the channel region of the first transistor T1. For example, since the lower line layer BML is electrically connected to the first contact region SE of the first transistor T1, floating of the lower line layer BML may be prevented.

The second contact region DE of the first transistor T1 may be connected to (or in contact with) the other end portion of the channel region CHA of the corresponding transistor T. Also, the second contact region DE of the first transistor T1 may be connected to (or in contact with) a second connection member TE2.

The second connection member TE2 may be provided and/or formed on the interlayer insulating layer ILD. The second connection member TE2 may be electrically and/or physically connected to the second contact region DE of the first transistor T1 through a contact hole penetrating the interlayer insulating layer ILD and the gate insulating layer GI.

In the above-described embodiment, a case where the first transistor T1 is a thin film transistors having a top gate structure has been described as an example. However, embodiments are not limited thereto, and the structure of the first transistor T1 may be variously modified.

The power line (e.g., the predetermined power line) may include, for example, a second power line PL2. The second power line PL2 may be provided and/or formed on the passivation layer PSV. The second power line PL2 and the bridge pattern layer BRP may be formed on the same layer (e.g., the passivation layer PSV). However, embodiments are not limited thereto, and the position of the second power line PL2 in the pixel circuit layer PCL may be variously changed. The voltage of the second driving power source VSS described with reference to FIG. 16. The second power line PL2 may include a conductive material (or a substance). In an example, the second power line PL2 may be formed as a single layer (or a single film) including at least one selected from the group consisting of copper (Cu), molybdenum (Mo), tungsten (W), aluminum neodymium (AlNd), titanium (Ti), aluminum (Al), silver (Ag), and any alloy thereof or a mixture thereof, or be formed in a double-layer (or a double-film) structure or a multi-layer (or a multi-film) structure including molybdenum (Mo), titanium (Ti), copper (Cu), aluminum (Al) or silver (Ag), which is a low-resistance material so as to decrease wiring resistance. In an example, the second power line PL2 may be formed as a double layer (or a double film) in which titanium (Ti)/copper (Cu) are sequentially stacked.

For example, the pixel circuit layer PCL may further include the first power line PL1 described with reference to FIG. 16. The voltage of the first driving power source VDD described with reference to FIG. 16 may be applied to the first power line PL1.

A via layer VIA may be provided and/or formed over the bridge pattern layer BRP and the second power line PL2.

The via layer VIA may include an organic insulating layer, an inorganic insulating layer, or the organic insulating layer disposed on the inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of acrylic resin, epoxy resin, phenolic resin, polyamide resin, polyimide resin, unsaturated polyester resin, poly-phenylene ether resin, poly-phenylene sulfide resin, and benzocyclobutene resin.

The via layer VIA may include a first contact hole CH1 corresponding to a contact hole of the passivation layer PSV, through which the second connection member TE2 electrically connected to the first transistor T1 is exposed. Also, the via layer VIA may include a second contact hole CH2 through which a portion of the second power line PL2 is exposed.

The display element layer DPL may be provided and/or formed on the via layer VIA (or the pixel circuit layer PCL).

The display element layer DPL may include a bank pattern layer BNKP, a bank BNK, first and second alignment electrodes ALE1 and ALE2, the first and second pixel electrodes PE1 and PE2, and first to fourth insulating layers INS1, INS2, INS3, and INS4. The light emitting element LD may have the same configuration as each light emitting element LD described with reference to FIG. 17, and substitute for each of light emitting elements LD.

The bank pattern layer BNKP may be provided and/or formed on the via layer VIA, and may be located in the emission area EMA in which light is emitted in the pixel PXL. The bank pattern layer BNKP may support each of the first and second alignment electrodes ALE1 and ALE2 to change a surface profile (or a shape) of each of the first and second alignment electrodes ALE1 and ALE2 such that light emitted from the light emitting element LD may be guided in an image display direction of the display panel DP (or the display device DD). The bank pattern layer BNKP may be an inorganic insulating layer including an inorganic material or an organic insulating layer including an organic material. In some embodiments, the bank pattern layer BNKP may include a single-layer organic insulating layer and/or a single-layer inorganic insulating layer, but embodiments are not limited thereto. In some embodiments, the bank pattern layer BNKP may be in the form of a multi-layer in which at least one organic insulating layer and at least one inorganic insulating layer are stacked. However, the material of the bank pattern layer BNKP is not limited thereto. In some embodiments, the bank pattern layer BNKP may include a conductive material.

The bank BNK may surround at least one side of a peripheral area (e.g., the non-emission area NEMA in which light is not emitted) of the pixel PXL. The bank BNK may be a pixel defining layer or a dam structure, which defines the emission area EMA to which the light emitting element LD is to be supplied, in a process of supplying the light emitting element LD to the pixel PXL. In an example, the emission area EMA of the pixel PXL may be defined (or divided) by the bank BNK, so that a mixed liquor (e.g., ink) including a desired amount and/or a desired kind of light emitting element LD may be supplied (or injected/input) to the emission area EMA. The bank BNK may include at least one light blocking material and/or at least one reflective material, to prevent a light leakage defect in which light (or beam) is leaked between the pixel PXL and pixels PXL adjacent thereto. In some embodiments, the bank BNK may include a transparent material (or a substance). In an example, the transparent material may include polyamide resin, polyimide resin, and the like, but embodiments are not limited thereto. In an embodiment, a reflective material layer may be separately provided and/or formed on the bank BNK so as to further improve the efficiency of light emitted from the pixel PXL.

Each of the first and second alignment electrodes ALE1 and ALE2 may be provided and/or formed over the bank pattern layer BNKP to have a surface profile corresponding to the shape of the bank pattern layer BNKP. Each of the first and second alignment electrodes ALE1 and ALE2 may be made of a material having a constant reflexibility to guide light emitted from the light emitting element LD in the image display direction of the display panel DP (or the display device DD). In an example, each of the first alignment electrode ALE1 and the second alignment electrode ALE2 may be formed of a conductive material (or a substance) having a constant reflexibility. The conductive material (or a material) may include an opaque metal advantageous in reflecting light emitted from the light emitting element LD in the image display direction of the display panel DP (or the display device DD). The opaque metal may include, for example, metals such as silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. In some embodiments, each of the first alignment electrode ALE1 and the second alignment electrode ALE2 may include a transparent conductive material (or a substance). In case that each of the first alignment electrode ALE1 and the second alignment electrode ALE2 includes a transparent conductive material (or a substance), a separated conductive layer may be added, which is made of an opaque metal for reflecting light emitted from the light emitting element LD in the image display direction of the display panel DP (or the display device DD). However, the material of the first alignment electrode ALE1 and the second alignment electrode ALE2 is not limited to the above-described materials.

The first alignment electrode ALE1 may be electrically connected to the first transistor T1 through the first contact hole CH1 penetrating the via layer VIA and the passivation layer PSV and the second connection member TE2, and the second alignment electrode ALE2 may be electrically connected to the second power line PL2 through the second contact hole CH2 penetrating the via layer VIA.

The light emitting element LD may be disposed between the first alignment electrode ALE1 and the second alignment electrode ALE2, and be electrically connected to each of the first and second alignment electrodes ALE1 and ALE2. The light emitting element LD may emit at least one of colored light and/or white light. The light emitting element LD may be in a form in which the light emitting element LD is sprayed in a mixed liquor to be input to the pixel PXL. The light emitting element LD may include a light emitting stack pattern in which a first semiconductor layer 11, an active layer 12, and a second semiconductor layer 13 are sequentially stacked along a direction (e.g., a horizontal direction). Also, the light emitting element LD may include an insulative film surrounding an outer circumferential surface of the light emitting stack pattern.

Light emitting elements LD may be mixed in a volatile solvent to be input (or supplied) to the pixel area PXA through an inkjet printing process or a slit coating process. In case that an alignment signal corresponding to each of the first alignment electrode ALE1 and the second alignment electrode ALE2, an electric field may be formed between the first alignment electrode ALE1 and the second alignment electrode ALE2. Therefore, the light emitting elements LD may be aligned between the first alignment electrode ALE1 and the second alignment electrode ALE2.

The light emitting element LD may be provided and/or formed on the first insulating layer INS1.

The first insulating layer INS1 may be provided and/or formed between each of the first alignment electrode ALE1 and the second alignment electrode ALE2 and the via layer VIA. The first insulating layer INS1 may fill a space between the light emitting light element LD and the via layer VIA, to stably support the light emitting element LD. The first insulating layer INS1 may include an inorganic insulating layer made of an inorganic material or an organic insulating layer made of an organic material. The first insulating layer INS1 may be partially opened to expose each of a portion of the first alignment electrode ALE1 and a portion of the second alignment electrode ALE2.

The second insulating layer INS2 may be provided and/or formed on the light emitting element LD. The second insulating layer INS2 may be provided and/or formed on the light emitting element LD, to cover a portion of a top surface (or an upper surface) of the light emitting element LD and to expose both end portions of the light emitting element LD to the outside. The second insulating layer INS2 may further fix the light emitting element LD.

The first pixel electrode PE1 and the second pixel electrode PE2 may be disposed to be spaced apart from each other on the second insulating layer INS2 on the light emitting element LD.

The first pixel electrode PE1 may be formed on the first alignment electrode ALE1 and an end portion of the light emitting element LD to be electrically connected to the end portion of the light emitting element LD. The first pixel electrode PE1 may be electrically and/or physically connected to the first alignment electrode ALE1 through being in direct contact with the first alignment electrode ALE1, which is exposed by removing a portion of the first insulating layer INS1. In an embodiment, the first pixel electrode PE1 may be an anode.

The second pixel electrode PE2 may be formed on the second alignment electrode ALE2 and the other end portion of the light emitting element LD to be electrically connected to the other end portion of the light emitting element LD. The second pixel electrode PE2 may be electrically and/or physically connected to the second alignment electrode ALE2 through being in contact with the second pixel electrode PE2, which is exposed by removing another portion of the first insulating layer INS1. In an embodiment, the second pixel electrode PE2 may be a cathode.

The first pixel electrode PE1 and the second pixel electrode PE2 may be formed of various transparent conductive materials such that light emitted from the light emitting element LD may transmit in the image display direction of the display device DD without any loss.

In an embodiment, the first pixel electrode PE1 and the second pixel electrode PE2 may be formed in different layers. The third insulating layer INS3 may be provided and/or formed between the first pixel electrode PE1 and the second pixel electrode PE2. The third insulating layer INS3 may be disposed over the first pixel electrode PE1 to cover the first pixel electrode PE1 (or not to expose the first pixel electrode PE1 to the outside), thereby preventing corrosion of the first pixel electrode PE1, or the like. The third insulating layer INS3 may include an inorganic insulating layer made of an inorganic material or an organic insulating layer made of an organic material.

The fourth insulating layer INS4 may be provided and/or formed over the first pixel electrode PE1 and the second pixel electrode PE2. The fourth insulating layer INS4 may be an inorganic layer (or inorganic insulating layer) including an inorganic material or an organic layer (or organic insulating layer) including an organic material. In an example, the fourth insulating layer INS4 may have a structure in which at least one inorganic layer and at least one organic layer are alternately stacked. The fourth insulating layer INS4 may partially or entirely cover the display element layer DPL, thereby blocking external moisture, external humidity or the like from being introduced (or permeated) into the display element layer DPL including the light emitting elements LD.

In some embodiments, as shown in FIG. 19, a dummy bank D_BNK and the color conversion layer CCL may be provided and/or formed on the fourth insulating layer INS4.

The dummy bank D_BNK may be located on the fourth insulating layer INS4 over the bank BNK. Therefore, the dummy bank D_BNK along with the bank BNK may form a dam part DAM (or a dam structure). The dam part DAM may be a structure which defines the emission area EMA in which light is emitted in the pixel PXL. In an embodiment, the dam part DAM may be a structure which defines the emission area EMA to which the color conversion layer CCL is to be supplied or formed. In an example, the emission area EMA of the pixel PXL may be defined (or divided) by the dam part DAM, so that a desired amount and/or a desired kind of color conversion layer CCL may be supplied (or input) to the emission area EMA.

The dummy bank D_BNK may include a light blocking material. In an example, the dummy bank D_BNK may be a black matrix layer. In some embodiments, the dummy bank D_BNK may include at least one light blocking material and/or at least one reflective material. Thus, the dummy bank D_BNK may transmit light emitted from the light emitting elements LD in the image display direction of the display device (or the third direction DR3), thereby improving light emission efficiency of the light emitting elements LD.

The color conversion layer CCL may be located on the fourth insulating layer INS4 over the first and second pixel electrodes PE1 and PE2. In an example, the color conversion layer CCL may be located in the emission area EMA of the pixel area PXA.

The color conversion layer CCL may include color conversion particles QD corresponding to a specific color. In an example, the color conversion layer CCL may include color conversion particles QD for converting light of a first color, which is emitted from light emitting elements LD, into light of a second color (or a specific color). In case that the pixel PXL is a red pixel (or a red sub-pixel), the color conversion layer CCL may include color conversion particles QD of a red quantum dot, which convert light of a first color, which is emitted from the light emitting elements LD, into light of a second color, e.g., red light. In case that the pixel PXL is a green pixel (or a green sub-pixel), the color conversion layer CCL may include color conversion particles QD of a green quantum dot, which convert light of a first color, which is emitted from the light emitting elements LD, into light of a second color, e.g., green light. In case that the pixel PXL is a blue pixel (or a blue sub-pixel), the color conversion layer CCL may include color conversion particles QD of a blue quantum dot, which convert light of a first color, which is emitted from the light emitting elements LD, into light of a second color, e.g., blue light. In some embodiments, in case that the pixel PXL is the blue pixel (or a blue sub-pixel), a light scattering layer including light scattering particles may be provided instead of the color conversion layer CCL including the color conversion particles QD. In an example, in case that the light emitting elements LD emit blue wavelength light, the pixel PXL may include a light scattering layer including light scattering particles SCT, in replacement of the color conversion layer CCL including the color conversion particles QD. The above-described light scattering layer may be omitted in some embodiments. In some embodiments, in case that the pixel PXL is the blue pixel (or a blue sub-pixel), transparent polymer may be provided or used instead of the color conversion layer CCL.

A capping layer CPL may be provided and/or formed over the color conversion layer CCL and the dummy bank D_BNK.

The capping layer CPL may be partially or entirely (or wholly) in the pixel area PXA, and be disposed (e.g., directly disposed) over the dummy bank D_BNK and the color conversion layer CCL. The capping layer CPL may be an inorganic layer (or an organic insulating layer) including an inorganic material. The capping layer CPL may include at least one of silicon nitride ($SiN_x$), silicon oxide ($SiO_x$), silicon oxynitride ($SiO_xN_y$), and metal oxide such as aluminum oxide ($AlO_x$). The capping layer CPL may cover the color conversion layer CCL with being located over the color conversion layer CCL, to protect the color conversion layer CCL.

In some embodiments, the capping layer CPL may have a flat surface with reducing a step difference occurring due to components disposed thereunder. In an embodiment, the capping layer CPL may include an organic layer including an organic material. The capping layer CPL may be a common layer commonly formed in the display area including the pixel area PXA, but embodiments are not limited thereto.

The color filter CF and a light blocking pattern layer LBP may be provided and/or formed on the capping layer CPL.

The color filter CF may selectively transmit light of a specific color therethrough. The color filter CF along with the color conversion layer CCL may form a light conversion pattern layer LCP, and include a color filter material which selectively transmit light of a specific color converted in the color conversion layer CCL therethrough. The color filter CF may include a red color filter, a green color filter, and a blue color filter. The above-described color filter CF may be disposed on a surface of the capping layer CPL corresponding to (or overlapping) the color conversion layer CCL.

The light conversion pattern layer LCP including the color conversion layer CCL and the color filter CF may correspond to the emission area EMA of the pixel PXL.

The light blocking pattern layer LBP may be disposed on the surface of the capping layer CPL to be adjacent to the color filter CF (e.g., in a horizontal direction). In an example, the light blocking pattern layer LBP may be located on the surface of the capping layer CPL corresponding to (or overlapping) the non-emission area NEMA of the pixel area PXA. The light blocking pattern layer LBP may correspond to (or overlap) the dam part DAM. The light blocking pattern layer LBP may include a light blocking material which prevents (or minimizes) a light leakage defect that light (or beam) is leaked between the pixel PXL and pixels adjacent thereto. In an example, the light blocking pattern layer LBP may include a black matrix layer. The light blocking pattern layer LBP may prevent (or minimize) color mixture of lights respectively emitted from adjacent pixels PXL.

The light blocking pattern layer LBP may be in the form of a multi-layer (or a multi-film) in which at least two color filters, which selectively transmit lights of different colors therethrough, overlap each other. In an example, the light blocking pattern layer LBP may include a red color filter, a green color filter overlapping the red color filter with being located on the red color filter, and a blue color filter overlapping the green color filter with being located on the green color filter. For example, the light blocking pattern layer LBP may be in the form of a structure in which a red color filter, a green color filter, and a blue color filter are sequentially stacked. The red color filter, the green color filter, and the blue color filter in the non-emission area NEMA of the pixel area PXA may be function as the light blocking pattern layer LBP which blocks transmission of light.

A cover layer CVL may be provided and/or formed over the light blocking pattern layer LBP and the color filter CF.

In the display device DD in accordance with the above-described embodiment, the light conversion pattern layer LCP may be disposed over the light emitting element LD, so that light having excellent color reproducibility may be emitted through the light conversion pattern layer LCP, thereby improving light emission efficiency.

In accordance with the disclosure, the central member, which couples the display panel and the support member to each other, may have a bending part (e.g., a continuous bending part), so that the central member may support a load of the display panel and maintain the center portion of the display panel in a process in which the display panel is rolled and unrolled, thereby minimizing shape deformation.

Thus, a phenomenon, which the display panel DP is rolled due to momentum of inertia in an unrolling process that the display panel DP is unrolled, may be effectively prevented minimized. For example, a standing characteristic (e.g., ability of maintaining a state in which the display panel is unrolled) may be improved.

For example, a portion at which the central member is coupled to the display panel may be implemented as the bending part, so that dividing structures for coupling or supporting of the display panel, and the like may be omitted. Thus, fine bending, fine lines, and damage of the display panel due to dividing structures of a coupling member or a support member may be prevented.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device comprising:
   a display panel including pixels;
   a first rotating member that rolls and unrolls the display panel;
   a support member supporting the display panel; and
   a central member disposed between the display panel and the support member, the central member coupling the display panel and the support member, wherein
   the central member includes a first bending part and a second bending part,
   the first bending part is bent in a first direction, and
   the second bending part is bent in a second direction opposite to the first direction.

2. The display device of claim 1, further comprising:
   a second rotating member that rolls and unrolls the support member.

3. The display device of claim 2, further comprising:
   a third rotating member that rolls and unrolls the central member.

4. The display device of claim 3, wherein the third rotating member is disposed between the first rotating member and the second rotating member.

5. The display device of claim 3, further comprising:
   a housing accommodating the display panel.

6. The display device of claim 5, wherein the first rotating member, the second rotating member, and the third rotating member are disposed in the housing.

7. The display device of claim 3, further comprising:
   a first guide bar disposed between the first rotating member and the second rotating member, wherein
   the first guide bar is disposed over the third rotating member.

8. The display device of claim 7, wherein a portion of the display panel and a portion of the central member, which face the first guide bar, are separated from each other by the first guide bar.

9. The display device of claim 3, further comprising:
   a second guide bar disposed between the first rotating member and the second rotating member, wherein
   the second guide bar is disposed over the third rotating member.

10. The display device of claim 9, wherein a portion of the support member and a portion of the central member, which face the second guide bar, are separated from each other by the second guide bar.

11. The display device of claim 1, wherein the first bending part is coupled to the display panel, and continuously extends along the display panel and the support member.

12. The display device of claim 1, wherein the second bending part is coupled to the support member, and continuously extends along the display panel and the support member.

13. A display device comprising:
   a display panel having pixels;
   a first rotating member that rolls and unrolls the display panel;

a support member supporting the display panel; and a central member disposed between the display panel and the support member, wherein the central member includes a first bending part coupled to the display panel and a second bending part coupled to the support member, the first bending part is bent in a first direction, and the second bending part is bent in a second direction opposite to the first direction.

14. The display device of claim 13, wherein the first bending part and the second bending part are alternately arranged.

15. The display device of claim 13, wherein the central member has elasticity.

16. The display device of claim 13, wherein the central member includes a base layer and an electrode layer on the base layer.

17. The display device of claim 16, wherein the electrode layer is disposed at the first bending part and the second bending part.

18. The display device of claim 16, wherein the first bending part and the display panel are coupled to each other by an electrostatic force.

19. The display device of claim 13, wherein the central member includes a magnet disposed at the first bending part and the second bending part.

20. The display device of claim 19, wherein the first bending part and the display panel are coupled to each other by a magnetic force.

* * * * *